US012660188B2

(12) United States Patent
Lee et al.

(10) Patent No.: US 12,660,188 B2
(45) Date of Patent: Jun. 16, 2026

(54) SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Gil Sung Lee, Suwon-si (KR); Suk Kang Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 448 days.

(21) Appl. No.: 18/475,784

(22) Filed: Sep. 27, 2023

(65) Prior Publication Data

US 2024/0215242 A1     Jun. 27, 2024

(30) Foreign Application Priority Data

Dec. 27, 2022     (KR) ........................ 10-2022-0185434

(51) Int. Cl.
| | |
|---|---|
| *H10B 43/27* | (2023.01) |
| *G11C 16/04* | (2006.01) |
| *H10B 43/10* | (2023.01) |
| *H10B 43/35* | (2023.01) |
| *H10B 43/40* | (2023.01) |
| *H10B 80/00* | (2026.01) |
| *H10W 90/00* | (2026.01) |

(Continued)

(52) U.S. Cl.
CPC ......... *H10B 43/27* (2023.02); *G11C 16/0483* (2013.01); *H10B 43/10* (2023.02); *H10B 43/35* (2023.02); *H10B 43/40* (2023.02);

*H10B 80/00* (2023.02); *H10W 90/00* (2026.01); *H10W 90/20* (2026.01)

(58) Field of Classification Search
None
See application file for complete search history.

(56) References Cited

U.S. PATENT DOCUMENTS

| | | | | |
|---|---|---|---|---|
| 9,905,572 B2 * | 2/2018 | Lee | ........................ | H10B 41/27 |
| 9,947,686 B2 * | 4/2018 | Son | ........................ | H10B 41/35 |

(Continued)

OTHER PUBLICATIONS

European Search Report dated Mar. 26, 2024 for corresponding European Patent Application No. 23196723.3.

(Continued)

*Primary Examiner* — Alia Sabur
(74) *Attorney, Agent, or Firm* — HARNESS, DICKEY & PIERCE, P.L.C.

(57) ABSTRACT

A semiconductor memory device may include a cell substrate, a mold structure including gate electrodes stacked on the cell substrate, a channel structures penetrating the mold structure; and a first cutting structure cutting some of the gate electrodes. The first cutting structure may include a first portion having a line shape extending in a first direction and a second portion having a line shape extending in a second direction. The first portion and the second portion may be alternately connected to form a zigzag shape. The first cutting structure may include a first side wall and a second side wall opposing the first side wall. A first point of the first side wall connected from the second portion to the first portion and a second point of the second side wall connected from the first portion to the second portion may be in corresponding channel structures among the channel structures.

20 Claims, 21 Drawing Sheets

(51) Int. Cl.
  *H01L 25/065* (2023.01)
  *H10W 90/20* (2026.01)

(56) References Cited

U.S. PATENT DOCUMENTS

| | | | | |
|---|---|---|---|---|
| 10,685,979 | B1 | 6/2020 | Lu et al. | |
| 10,749,042 | B2 | 8/2020 | Kim et al. | |
| 10,930,670 | B2 * | 2/2021 | Shin | H10D 84/016 |
| 11,004,862 | B2 * | 5/2021 | Kim | H10B 43/10 |
| 11,121,151 | B2 | 9/2021 | Kang et al. | |
| 11,502,101 | B2 * | 11/2022 | Kanamori | G11C 8/14 |
| 11,563,024 | B2 * | 1/2023 | Wells | H10B 43/35 |
| 11,672,122 | B2 * | 6/2023 | Jung | H10B 43/27 |
| | | | | 257/314 |
| 11,894,360 | B2 * | 2/2024 | Kim | H10B 43/27 |
| 11,991,880 | B2 * | 5/2024 | Lu | H10B 43/35 |
| 12,156,405 | B2 * | 11/2024 | Lee | H10B 43/27 |

| | | | | |
|---|---|---|---|---|
| 2015/0115345 | A1 | 4/2015 | Nowak et al. | |
| 2021/0242236 | A1 | 8/2021 | Shin et al. | |
| 2021/0288054 | A1 * | 9/2021 | Ryu | H10B 43/10 |
| 2021/0288067 | A1 | 9/2021 | Kanamori et al. | |
| 2022/0093631 | A1 | 3/2022 | Kanamori et al. | |
| 2022/0149071 | A1 | 5/2022 | Lee | |
| 2022/0367499 | A1 | 11/2022 | Matsuno et al. | |
| 2023/0180474 | A1 * | 6/2023 | Park | H10B 43/27 |
| | | | | 257/324 |
| 2023/0354603 | A1 * | 11/2023 | Choi | H10B 43/35 |
| 2024/0221833 | A1 * | 7/2024 | Jung | H10B 43/10 |
| 2025/0008733 | A1 * | 1/2025 | Choi | H10B 43/10 |
| 2025/0324592 | A1 * | 10/2025 | Li | H10B 41/27 |

OTHER PUBLICATIONS

European Office Action dated Apr. 5, 2024 for corresponding European Patent Application No. 23196723.3.

* cited by examiner

SEMICONDUCTOR MEMORY DEVICE AND ELECTRONIC SYSTEM INCLUDING THE SAME

CROSS-REFERENCE TO RELATED APPLICATION

This application claims priority from Korean Patent Application No. 10-2022-0185434 filed on Dec. 27, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor memory device and/or an electronic system including the same.

2. Description of the Related Art

As a semiconductor memory device capable of storing a high capacity of data may be required in an electronic system, methods to increase the data storage capacity of the semiconductor memory device are being researched. As one of methods of increasing the data storage capacity of the semiconductor memory device, a semiconductor memory device including memory cells arranged three-dimensionally instead of memory cells arranged two-dimensionally has been proposed.

SUMMARY

Aspects of the present disclosure provide a semiconductor memory device having improved product reliability.

Aspects of the present disclosure also provide an electronic system including a semiconductor memory device having improved product reliability.

According to an example embodiment of the present disclosure, a semiconductor memory device may include a cell substrate including a cell region and an extension region; a mold structure including a plurality of gate electrodes sequentially stacked on the cell substrate; a plurality of first channel structures penetrating the mold structure and arranged in a first direction on the cell region; a plurality of second channel structures penetrating the mold structure, the plurality of second channel structures being adjacent to the plurality of first channel structures in a second direction and arranged in the first direction on the cell region such that the plurality of first channel structures and the plurality of second channel structures are arranged in a zigzag pattern on the cell region; and a cutting structure including a first portion and a second portion that each have a line shape. The first portion may extend in a third direction from inside of each of the plurality of first channel structures to inside of each of the plurality of second channel structures adjacent to each of the plurality of first channel structures. The second portion may extend in a fourth direction from inside of each of the plurality of second channel structures to inside of each of the plurality of first channel structures adjacent to each of the plurality of second channel structures. The fourth direction may be different from the third direction. The cutting structure may cut some of the plurality of gate electrodes.

According to an example embodiment of the present disclosure, a semiconductor memory device may include a cell substrate; a mold structure including a plurality of gate electrodes sequentially stacked on the cell substrate; a plurality of channel structures penetrating the mold structure; and a first cutting structure cutting some of the plurality of gate electrodes, the first cutting structure including a first portion having a line shape extending in a first direction and a second portion having a line shape extending in a second direction, the first portion and the second portion being alternately connected to form a zigzag shape. The first cutting structure may include a first side wall and a second side wall opposing the first side wall. A first point of the first side wall connected from the second portion to the first portion and a second point of the second side wall connected from the first portion to the second portion may be in corresponding channel structures among the plurality of channel structures.

According to an example embodiment of the present disclosure, an electronic system may include a main board; a semiconductor memory device on the main board; and a controller on the main board, the controller being electrically connected to the semiconductor memory device. The semiconductor memory device may include a cell substrate, a mold structure including a plurality of gate electrodes sequentially stacked on the cell substrate, a plurality of channel structures penetrating the mold structure, and a cutting structure cutting a part of the mold structure. Each of the plurality of gate electrodes may be connected to the controller. The cutting structure may include a first portion having a line shape extending in a first direction and a second portion having a line shape extending in a second direction. The first portion and the second portion may be alternately connected to form a zigzag shape. The cutting structure may include a first side wall and a second side wall opposing the first side wall. A first point of the first side wall connected from the second portion to the first portion and a second point of the second side wall connected from the first portion to the second portion may be in corresponding channel structures among the plurality of channel structures.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
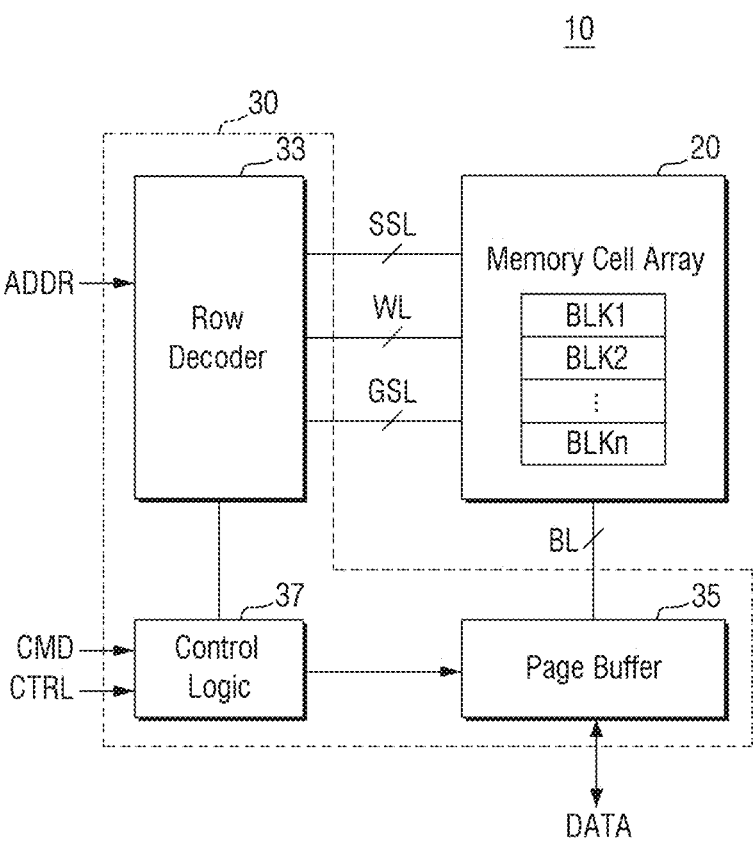
FIG. 1 is an example block diagram for explaining a semiconductor memory device according to some embodiments.

FIG. 1 is an example block diagram for explaining a semiconductor memory device according to some embodiments.

Referring to FIG. 1, a semiconductor memory device 10 according to some embodiments includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL, and at least one ground selection line GSL. The memory cell blocks BLK1 to BLKn may be connected to a row decoder 33 through the word line WL, the string selection line SSL, and the ground selection line GSL. Also, the memory cell blocks BLK1 to BLKn may be connected to a page buffer 35 through the bit line BL.

The peripheral circuit 30 may receive an address ADDR, a command CMD, and a control signal CTRL from outside of the semiconductor memory device 10, and may transmit and receive data DATA to and from a device outside the semiconductor memory device 10. The peripheral circuit 30 may include a control logic 37, a row decoder 33, and a page buffer 35. Although not shown, the peripheral circuit 30 may further include various sub-circuits such as an I/O circuit, a voltage generation circuit that generates various voltages necessary for the operation of the semiconductor memory device 10, and an error correction circuit that corrects errors of the data DATA read from the memory cell array 20.

The control logic 37 may be connected to the row decoder 33, the I/O circuit, and the voltage generation circuit. The control logic 37 may control the overall operations of the semiconductor memory device 10. The control logic 37 may generate various internal control signals used inside the semiconductor memory device 10 in response to the control signal CTRL. For example, the control logic 37 may adjust the voltage levels provided to the word line WL and the bit line BL when performing a memory operation such as a program operation or an erase operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. Further, the row decoder 33 may transfer a voltage for performing the memory operation to the word line WL of the selected memory cell blocks BLK1 to BLKn.

The page buffer 35 may be connected to the memory cell array 20 through the bit line BL. The page buffer 35 may operate as a writer driver or a sense amplifier. For example, when the program operation is performed, the page buffer 35 may operate as the writer driver to apply a voltage according to the data DATA to be stored in the memory cell array 20 to the bit line BL. On the other hand, when the read operation is performed, the page buffer 35 may operate as a sense amplifier to sense the data DATA stored in the memory cell array 20.

Figure 2:
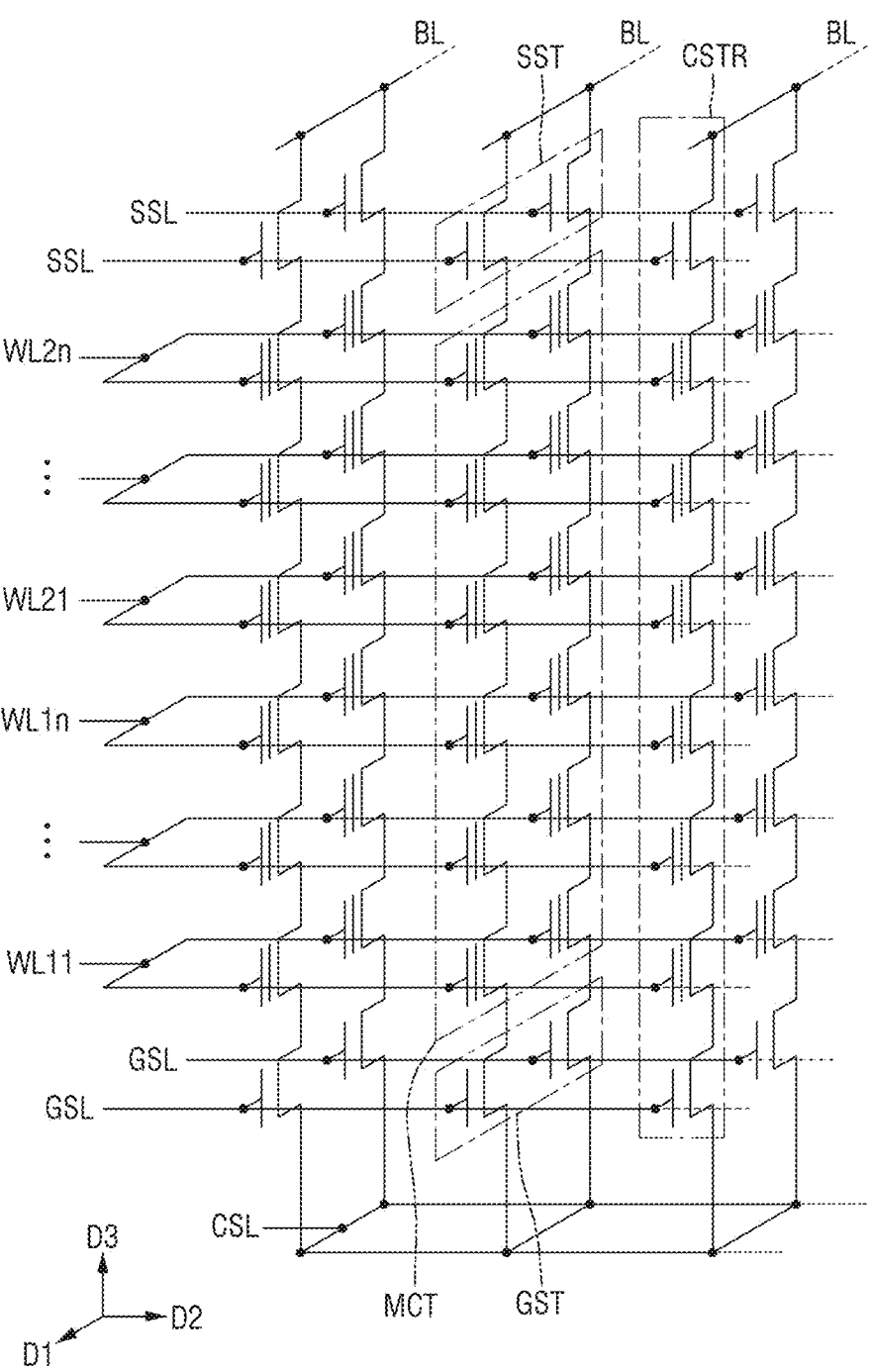
FIG. 2 is an example circuit diagram for explaining the semiconductor memory device according to some embodiments.

FIG. 2 is an example circuit diagram for explaining a semiconductor memory device according to some embodiments.

Referring to FIG. 2, the memory cell array (e.g., 20 of FIG. 1) of the semiconductor device according to some embodiments may include a common source line CSL, a plurality of bit lines BL, and a plurality of cell strings CSTR.

The common source line CSL may extend in a second direction D2. In some embodiments, a plurality of common source lines CSL may be arranged two-dimensionally. For example, the plurality of common source lines CSL may be spaced apart from each other and each extend in the second direction D2. The same voltage may be electrically applied to the common source lines CSL, or different voltages are applied to the common source lines CSL and the common source lines CSL may be controlled separately.

The plurality of bit lines BL may be arranged two-dimensionally. For example, the bit lines BL are spaced apart from each other and may each extend in a first direction D1 that intersects the second direction D2. A plurality of cell strings CSTR may be connected in parallel to each bit line BL. The cell strings CSTR may be commonly connected to the common source line CSL. That is, the plurality of cell strings CSTR may be placed between the bit line BL and the common source line CSL.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the string selection transistor SST and the memory cell transistors MCT may be connected in series.

The common source line CSL may be commonly connected to sources of the ground selection transistors GST. Also, the ground selection line GSL, a plurality of word lines WL11 to WL1$n$ and WL21 to WL2$n$, and the string selection line SSL may be placed between the common source line CSL and the bit line BL. The ground selection line GSL may be used as a gate electrode of the ground selection transistor GST, the word lines WL11 to WL1$n$ and WL21 to WL2$n$ may be used as gate electrodes of the memory cell transistors MCT, and the string selection line SSL may be used as the gate electrode of the string selection transistor SST.

Figure 3:
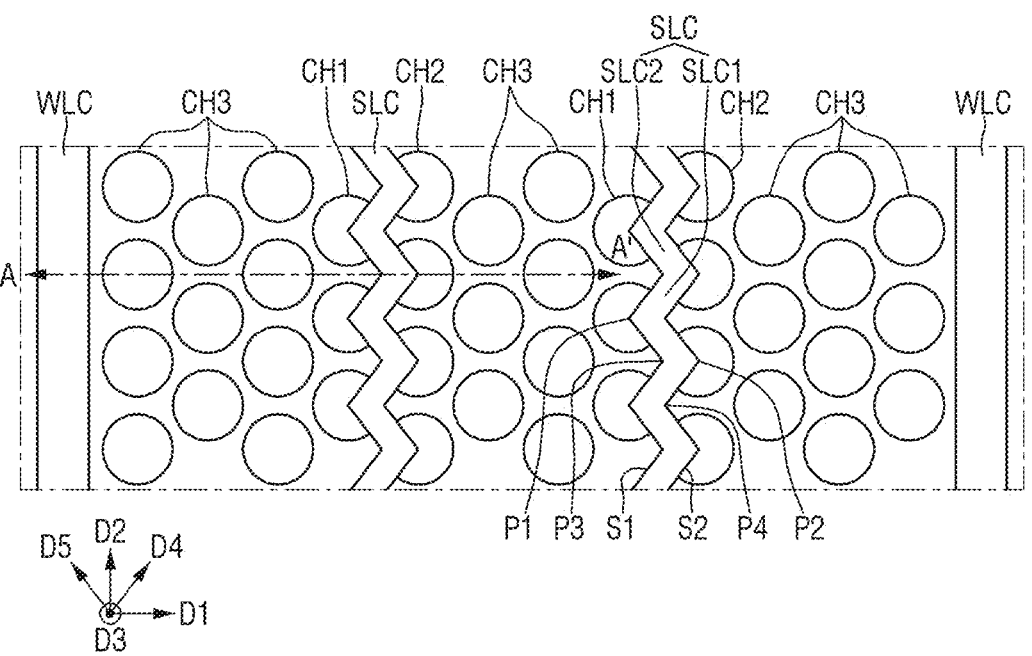
FIG. 3 is a layout diagram of the semiconductor memory device according to some embodiments.
Figure 4:
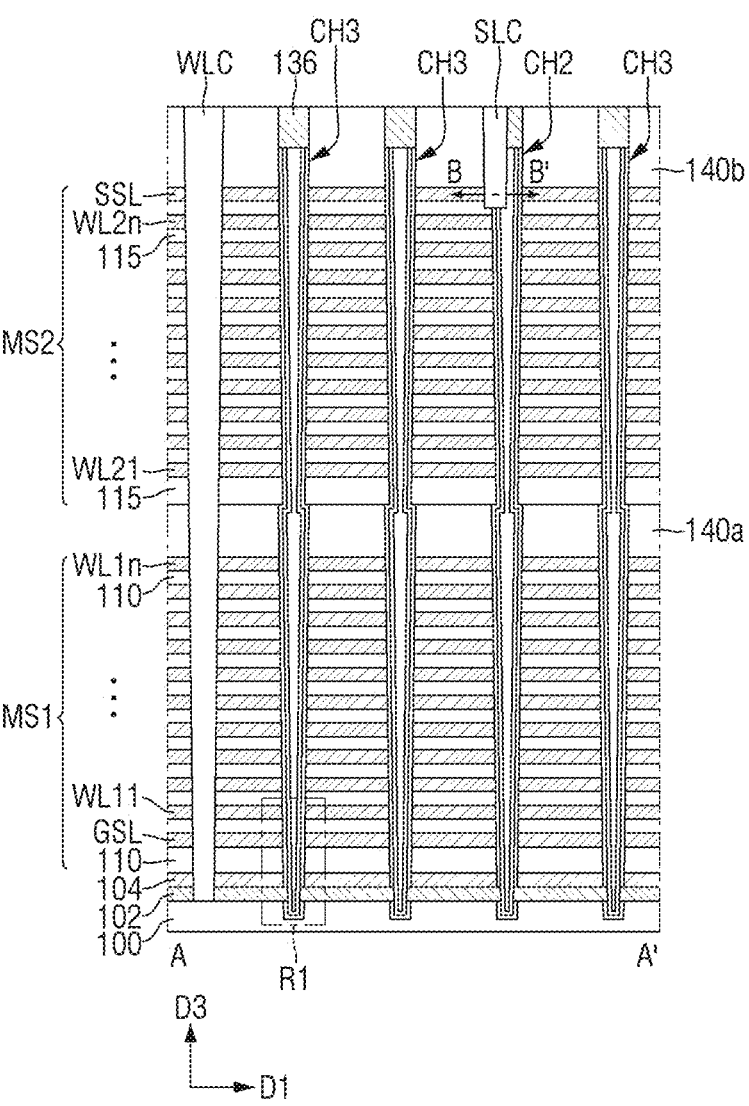
FIG. 4 is a cross-sectional view taken along a line A-A' of FIG. 3.
Figure 5:
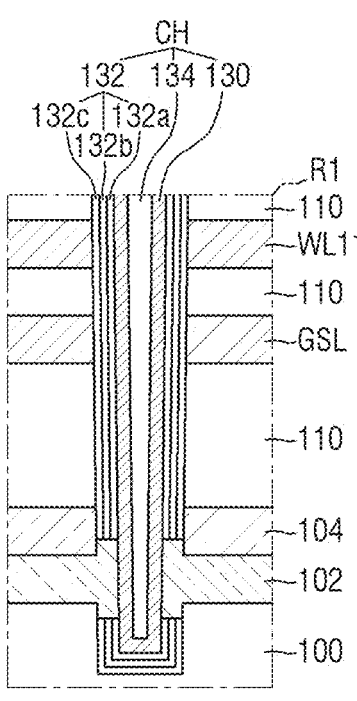
FIG. 5 is an enlarged view of a region R1 of FIG. 4.
Figure 6:
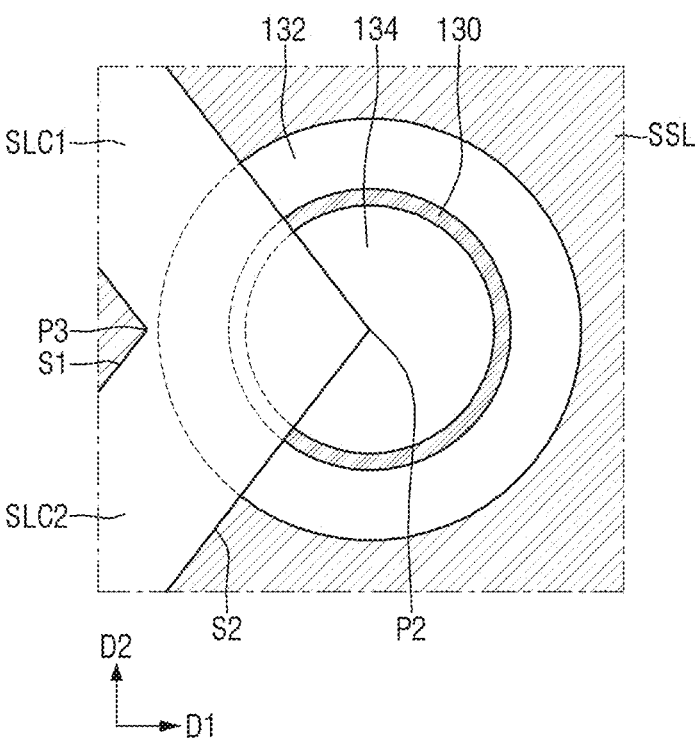
FIG. 6 is a cross-sectional view taken along a line B-B' of FIG. 4.

FIG. 3 is a layout diagram of a semiconductor memory device according to some embodiments. FIG. 4 is a cross-sectional view taken along a line A-A' of FIG. 3. FIG. 5 is an enlarged view of R1 of FIG. 4. FIG. 6 is a cross-sectional view taken along a line B-B' of FIG. 4.

Referring to FIGS. 3 to 6, the semiconductor memory device according to some embodiments may include a cell substrate 100, mold structures MS1 and MS2, channel structures CH1, CH2 and CH3, a word line cutting structure WLC, and a string cutting structure SLC.

The cell substrate 100 may include, for example, a semiconductor substrate such as a silicon substrate, a germanium substrate or a silicon-germanium substrate. Alternatively, the cell substrate 100 may include a silicon-on-insulator (SOI) substrate, a germanium-on-insulator (GOI) substrate, and the like. In some embodiments, the cell substrate 100 may include impurities. For example, the cell substrate 100 may include n-type impurities (e.g., phosphorus (P), arsenic (As), etc.).

In the following description, a surface of the cell substrate 100 on which the mold structures MS1 and MS2 are placed may be referred to as a front side or an upper side of the cell substrate 100. In contrast, a surface of the cell substrate 100 opposite to the front side of the cell substrate 100 may be referred to as a back side or a lower side of the cell substrate 100. In addition, in the following description, the upper side, the lower side, the upper part, and the lower part may be based on a third direction D3.

The mold structures MS1 and MS2 may be placed on the cell substrate 100. The mold structures MS1 and MS2 may include a plurality of gate electrodes GSL, WL11 to WL1n, WL21 to WL2n, and SSL and a plurality of mold insulating films 110 and 115 stacked on the cell substrate 100. Each of the gate electrodes GSL, WL11 to WL1n, WL21 to WL2n and SSL, and each of the mold insulating films 110 and 115 may have a layered structure extending parallel to the front side of the cell substrate 100. The gate electrodes GSL, WL11 to WL1n, WL21 to WL2n and SSL are spaced apart from each other by the mold insulating films 110 and 115, and may be sequentially stacked on the cell substrate 100.

In some embodiments, the mold structures MS1 and MS2 may include a first mold structure MS1 and a second mold structure MS2 sequentially stacked on the cell substrate 100. In some other embodiments, the number of stacks sequentially stacked on the cell substrate 100 may be three or more.

The first mold structure MS1 may include first gate electrodes GSL and WL11 to WL1n and first mold insulating films 110 that are alternately stacked on the cell substrate 100. In some embodiments, the first gate electrodes GSL and WL11 to WL1n may include a ground selection line GSL and a plurality of first word lines WL11 to WL1n, which are sequentially stacked on the cell substrate 100 (e.g., in the third direction D3). The third direction D3 may be a direction perpendicular to the front side of the cell substrate 100. In some other embodiments, the first gate electrodes GSL and WL11 to WL1n may include two or more ground selection lines. In some other embodiments, the first mold structure MS1 may further include an erasure control line between the ground selection line GSL and the first word line WL11.

The second mold structure MS2 may include second gate electrodes WL21 to WL2n and SSL, and second mold insulating films 115 which are alternately stacked on the first mold structure MS1. In some embodiments, the second gate electrodes WL21 to WL2n and SSL may include a plurality of second word lines WL21 to WL2n and a string selection line SSL which are sequentially stacked on the first mold structure MS1 (e.g., in the third direction D3). In some other embodiments, the second gate electrodes WL21 to WL2n and SSL may include two or more string selection lines.

The gate electrodes GSL, WL11 to WL1n, WL21 to WL2n, and SSL may each include, but are not limited to, a conductive material, for example, a metal such as tungsten (W), cobalt (Co), and nickel (Ni) or a semiconductor material such as silicon.

Each of the mold insulating films 110 and 115 may include, but is not limited to, an insulating material, for example, at least one of silicon oxide, silicon nitride and silicon oxynitride.

Interlayer insulating films 140a and 140b may be formed on the cell substrate 100 to cover the mold structures MS1 and MS2. In some embodiments, the interlayer insulating films 140a and 140b may include a first interlayer insulating film 140a and a second interlayer insulating film 140b which are sequentially stacked on the cell substrate 100. The first interlayer insulating film 140a may cover the first mold structure MS1, and the second interlayer insulating film 140b may cover the second mold structure MS2. The interlayer insulating films 140a and 140b may include, for example, but are not limited to, at least one of silicon oxide, silicon oxynitride, and a low-k material having a lower dielectric constant than silicon oxide Channel structures CH1, CH2 and CH3 may be placed on the cell substrate 100. The channel structures CH1, CH2 and CH3 may be formed in the mold structures MS1 and MS2. The channel structures CH1, CH2 and CH3 may extend in the third direction D3 and penetrate the mold structures MS1 and MS2. For example, the channel structures CH1, CH2 and CH3 may have a pillar shape (for example, a cylindrical shape) extending in the third direction D3. Therefore, the channel structures CH1, CH2 and CH3 may intersect the respective gate electrodes GSL, WL11 to WL1n, WL21 to WL2n, and SSL. In some embodiments, the channel structures CH1, CH2 and CH3 may have a bend portion between the first mold structure MS1 and the second mold structure MS2. For example, widths of the channel structures CH1, CH2 and CH3 in the first mold structure MS1 and the second mold structure MS2 may increase as they go away from the cell substrate 100, and maximum widths of the channel structures CH1, CH2 and CH3 in the first mold structure MS1 may be greater than minimum widths of the channel structures CH1, CH2 and CH3 in the second mold structure MS2.

Referring to FIGS. 5 and 6, the channel structures CH1, CH2 and CH3 may include a semiconductor pattern 130 and an information storage film 132.

The semiconductor pattern 130 may extend in the third direction D3 and penetrate the mold structures MS1 and MS2. Although the semiconductor pattern 130 is only shown to have a cup shape, this is merely an example. For example, the semiconductor pattern 130 may have various shapes such as a cylindrical shape, a rectangular barrel shape, and a solid pillar shape. The semiconductor pattern 130 may include, for example, but is not limited to, a semiconductor material such as single crystal silicon, polycrystalline silicon, an organic semiconductor substance and a carbon nanostructure.

The information storage film 132 may be placed between the semiconductor pattern 130 and the mold structures MS1 and MS2. The information storage film 132 may be interposed between the semiconductor pattern 130 and each of the gate electrodes GSL, WL11 to WL1n, WL21 to WL2n and SSL. For example, the information storage film 132 may extend along the outer side face of the semiconductor pattern 130. The information storage film 132 may include, for example, at least one of silicon oxide, silicon nitride, silicon oxynitride, and high dielectric constant materials having a higher dielectric constant than silicon oxide. The high dielectric constant materials may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the information storage film 132 may be formed of multiple films. For example, the information storage film 132 may include a tunnel insulating film 132a, a charge storage film 132b, and a blocking insulating film 132c that are sequentially stacked on the outer surface of the semiconductor pattern 130.

The tunnel insulating film 132a may include, for example, silicon oxide or a high dielectric constant material having a higher dielectric constant than silicon oxide (e.g., aluminum oxide ($Al_2O_3$), and hafnium oxide ($HfO_2$)). The charge storage film 132b may include, for example, silicon nitride. The blocking insulating film 132c may include, for example, silicon oxide or a high dielectric constant material having a higher dielectric constant than silicon oxide (e.g., aluminum oxide ($Al_2O_3$), and hafnium oxide ($HfO_2$)).

In some embodiments, the channel structures CH1, CH2 and CH3 may further include a filling pattern 134. The filling pattern 134 may be formed to fill the inside of the cup-shaped semiconductor pattern 130. The filling pattern 134 may include, but is not limited to, an insulating material, for example, silicon oxide.

In some embodiments, the channel structures CH1, CH2 and CH3 may further include a channel pad 136. The channel pad 136 may be formed to be connected to the upper part of the semiconductor pattern 130. The channel pad 136 may include, for example, but is not limited to, impurity-doped polysilicon.

The channel structures CH1, CH2 and CH3 may be arranged in the form of zigzag. The channel structures CH1, CH2 and CH3 may be alternately arranged in a first direction D1 and a second direction D2 parallel to the front side of the cell substrate 100. The channel structures CH1, CH2, and CH3 arranged in the form of zigzag may further improve the degree of integration of the semiconductor memory device. In some embodiments, the plurality of channel structures CH1, CH2 and CH3 may be arranged in the form of honeycomb.

In some embodiments, the first source structures 102 and 104 may be placed on the cell substrate 100. The first source structures 102 and 104 may be interposed between the cell substrate 100 and the mold structures MS1 and MS2. For example, the first source structures 102 and 104 may extend along the front side of the cell substrate 100. The first source structures 102 and 104 may be formed to be connected to the semiconductor patterns 130 of the channel structures CH1, CH2 and CH3. For example, the first source structures 102 and 104 may penetrate the information storage film 132 to come into contact with the semiconductor pattern 130. Such first source structures 102 and 104 may be provided as a common source line (e.g., CSL of FIG. 2) of the semiconductor memory device. The first source structures 102 and 104 may include, for example, but are not limited to, impurity-doped polysilicon or metal.

In some embodiments, the channel structures CH1, CH2 and CH3 may penetrate the first source structures 102 and 104. For example, lower parts of the channel structures CH1, CH2 and CH3 may penetrate the first source structures 102 and 104, and be placed inside the cell substrate 100.

In some embodiments, the first source structures 102 and 104 may be formed of multiple films. For example, the first source structures 102 and 104 may include a first source layer 102 and a second source layer 104 that are sequentially stacked on the cell substrate 100. The first source layer 102 and the second source layer 104 may each include, but are not limited to, impurity-doped polysilicon or impurity-undoped polysilicon. The first source layer 102 may be in contact with the semiconductor pattern 130 and provided as a common source line (e.g., CSL of FIG. 2) of the semiconductor memory device. The second source layer 104 may be used as a support layer for preventing falling or collapsing of the mold stack in a replacement process for forming the first source layer 102.

For example, a base insulating film may be interposed between the cell substrate 100 and the first source structures 102 and 104. The base insulating film may include, for example, but is not limited to, at least one of silicon oxide, silicon nitride and silicon oxynitride.

Referring to FIGS. 3 and 4, the word line cutting structure WLC may extend in the third direction D3 to penetrate the mold structures MS1 and MS2. The word line cutting structure WLC may, for example, extend into the mold structures MS1 and MS2 from the upper sides of the mold structures MS1 and MS2. The word line cutting structure WLC may extend in the second direction D2 to cut the mold structures MS1 and MS2. The word line cutting structure WLC may be arranged along the first direction D1. The mold structures MS1 and MS2 may be cut by a plurality of word line cutting structures WLC to form a plurality of memory cell blocks (e.g., BLK1 to BLKn of FIG. 1). For example, two adjacent word line cutting structures WLC may define one memory cell block between them. A plurality of channel structures CH1, CH2 and CH3 may be placed inside each memory cell block defined by the word line cutting structure WLC.

Although the number of channel structures CH1, CH2 and CH3 arranged in zigzags along the first direction D1 in one memory cell block is only shown as twelve, this is only an example. It goes without saying that the number of channel structures CH1, CH2 and CH3 placed in each memory cell block is not limited to the shown one and may vary.

In some embodiments, the word line cutting structure WLC may extend in the second direction D2 to cut the first source structures 102 and 104. For example, the lower side of the word line cutting structure WLC may be placed on the same plane as the lower sides of the first source structures 102 and 104. As another example, the lower side of the word line cutting structure WLC may be lower than the lower sides of the first source structures 102 and 104.

The word line cutting structure WLC may include an insulating material. The word line cutting structure WLC may include, for example, but is not limited to, at least one of silicon oxide, silicon nitride and silicon oxynitride.

The mold structures MS1 and MS2 may include a cutting structure that cuts some of the gate electrodes GSL, WL11 to WL1n, WL21 to WL2n and SSL. In some embodiments, a string cutting structure SLC may be formed inside the second mold structure MS2. The string cutting structure SLC may penetrate the gate electrode, that is, the string selection line SSL, placed at the uppermost part of the mold structures MS1 and MS2. The string cutting structure SLC may extend in the third direction D3 to penetrate a part of the string selection line SSL and the channel structures CH1 and CH2. The string cutting structure SLC may, for example, extend from the upper side of the mold structures MS1 and MS2 into the mold structures MS1 and MS2. The string cutting structure SLC may extend in the second direction D2 to cut the string selection line SSL. A lower side of the string cutting structure SLC may be placed at a height between the second gate electrode WL2n and the string selection line SSL on the basis of the cell substrate 100.

In some embodiments, the channel structures CH1, CH2 and CH3 may include first and second channel structures CH1 and CH2 inside which the string cutting structure SLC is placed, and third channel structures CH3 inside which no string cutting structure SLC is placed. The first channel structures CH1 and the second channel structures CH2 may each be arranged along the second direction D2. The second channel structures CH2 may be adjacent to the first channel structures CH1 in the first direction D1 and may be arranged in zigzags with the first channel structure CH1. The third channel structures CH3 may be adjacent to the first channel structures CH1 or the second channel structures CH2 in the first direction D1, arranged along the second direction D2, and be arranged in zigzags with the first channel structures CH1 or the second channel structures CH2. The first to third channel structures CH1, CH2 and CH3 may be arranged in zigzags.

The string cutting structure SLC may include a first portion SLC1 that extends from inside of the first channel structures CH1 to inside of each second channel structure CH2 adjacent to each first channel structure CH1 in a fourth direction D4, and a second portion SLC2 that extends from inside of each second channel structure CH2 to inside of each first channel structure CH1 adjacent to each second channel structure CH2 in a fifth direction D5. The first portion SLC1 may have a line shape extending in the fourth direction D4, and the second portion SLC2 may have a line shape extending in the fifth direction D5. The first portion SLC1 and the second portion SLC2 may be alternately arranged along the second direction D2 and connected to each other. The string cutting structure SLC may have a zigzag shape extending along the second direction D2. The first portion SLC1 and the second portion SLC2 sequentially placed and connected in the second direction D2 may have a shape of ">", and the second portion SLC2 and the first portion SLC1 sequentially placed and connected in the second direction D2 may have a shape of "<". The portion connected from the first portion SLC1 to the second portion SLC2 of the string cutting structure SLC, and the portion connected from the second portion SLC2 to the first portion SLC1 may be rounded without being angulated.

The fourth direction D4 may be a direction between the first direction D1 and the second direction D2, and the fifth direction D5 may be between a direction opposite to the first direction D1 and the second direction D2. The fourth and fifth directions D4 and D5 may be directions parallel to the front side of the cell substrate 100.

The string cutting structure SLC may include a first side wall S1 and a second side wall S2 that are opposite to each other. The first side wall S1 and the second side wall S2 may be parallel to each other. The first side wall S1 and the second side wall S2 may extend along the second direction D2 in zigzags. A first point P1 of the first side wall S1 connected from the second portion SLC2 to the first portion SLC1, and a second point P2 of the second side wall S2 connected from the first portion SLC1 to the second portion SLC2 may be placed inside the first and second channel structures CH1 and CH2. The first point P1 may be placed inside the first channel structures CH1, and the second point P2 may be placed inside the second channel structures CH2.

Referring to FIGS. 3 and 6, the first point P1 and the second point P2 may be placed, for example, inside the semiconductor pattern 130. For example, from a planar viewpoint including the first and second directions D1 and D2, the first point P1 may be placed at the center of the first channel structure CH1, and the second point P2 may be placed at the center of the second channel structure CH2.

In some embodiments, a third point P3 of the first side wall S1 connected from the first portion SLC1 to the second portion SLC2, and a fourth point P4 of the second side wall S2 connected from the second portion SLC2 to the first portion SLC1 may be spaced apart from the channel structures CH1, CH2 and CH3. The third point P3 of the first side wall S1 and the fourth point P4 of the second side wall S2 may be placed outside the channel structures CH1, CH2 and CH3. The third point P3 of the first side wall S1 may be placed outside the second channel structure CH2 inside which the second point P2 of the second side wall S2 opposite to (e.g., in the first direction D1) to the third point P3 is placed, and the fourth point P4 of the second side wall S2 may be placed outside the first channel structure CH1 inside which the first point P1 of the first side wall S1 opposite (e.g., in the first direction D1) to the fourth point P4 is placed inside. The string cutting structure SLC between the first point P1 of the first side wall S1 and the fourth point P4 of the second side wall S2 opposite to each other (e.g., in the first direction D1) may be placed inside the first channel structure CH1 and the second mold structure MS2, and the string cutting structure SLC between the third point P3 of the first side wall S1 and the second point P2 of the second side wall S2 opposite to each other (e.g., in the first direction D1) may be placed inside the second channel structure CH2 and the second mold structure MS2. The first and second channel structures CH1 and CH2 inside which at least a part of the string cutting structure SLC is placed may have a sector shape from a planar viewpoint including the first and second directions D1 and D2. The first channel structures CH1 may be arranged on the first side wall S1 of the string cutting structure SLC along the second direction D2, and the second channel structures CH2 may be arranged on the second side wall S2 of the string cutting structure SLC2 along the second direction D2. The first channel structures CH1 may wrap a portion connected from the second portion SLC2 to the first portion SLC1, and the second channel structures CH2 may wrap a portion connected from the first portion SLC1 to the second portion SLC2.

Referring to FIG. 3, the string cutting structure SLC may be arranged along the first direction D1. Each memory cell block defined by the word line cutting structure WLC may be divided by the string cutting structure SLC to form a plurality of string regions. For example, the string cutting structures SLC may be arranged in the first direction D1, and may define three string regions inside one memory cell block.

For example, the string cutting structures SLC arranged in the second direction D2 may each have the same shape. As another example, at least some of the string cutting structures SLC arranged in the second direction D2 may have different shapes from each other. For example, at least two string cutting structures SLC may have shapes symmetrical to each other on the basis of the first direction D1.

In some embodiments, third channel structures CH3 may be arranged in at least one of a position between the word line cutting structure WLC and the string cutting structure SLC adjacent to each other in the first direction D1, and a position between the string cutting structures SLC adjacent to each other in the first direction D1. The third channel structures CH3 may be placed, for example, in a plurality of columns along the first direction D1. The first to third channel structures CH1, CH2 and CH3 may be arranged in zigzags.

The string cutting structure SLC may include an insulating material, for example, but is not limited to, at least one of silicon oxide, silicon nitride and silicon oxynitride.

When the string cutting structure SLC has a line shape, a width of the string cutting structure SLC is determined in consideration of an interval in the first direction D1 between the channel structures CH1, CH2 and CH3, diameters of the channel structures CH1, CH2 and CH3, and the like. However, in the semiconductor memory device according to some embodiments, because the string cutting structure SLC has a zigzag shape, a margin for the width of the string cutting structure SLC increases as compared to a case where the string cutting structure SLC has a line shape, and the process becomes easier. Also, since the semiconductor pattern 130 is etched together with the zigzag-shaped string cutting structure SLC, there is no need for a process of trimming a part of the semiconductor pattern 130. Although at least a part of the channel pad 136 may be lost at the time of the trimming process, since the semiconductor memory device according to some embodiments does not require the trimming process, a problem of the loss of the channel pad 136 does not occur.

Figure 7:
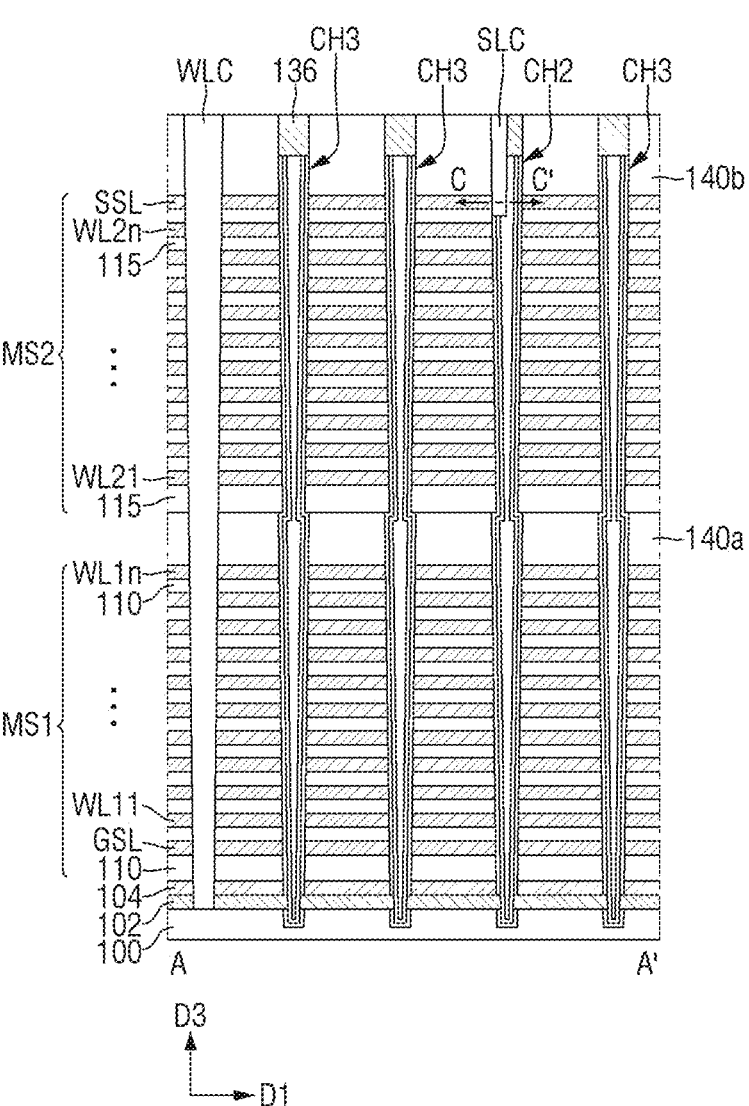
FIG. 7 is a cross-sectional view taken along a line A-A' of FIG. 3.
Figure 8:
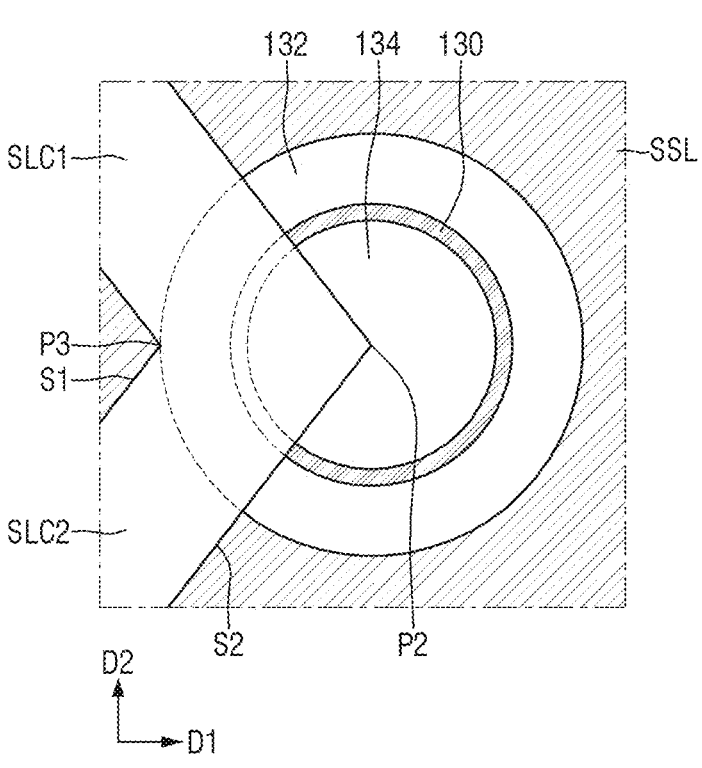
FIG. 8 is a cross-sectional view taken along a line C-C' of FIG. 7.

FIG. 7 is a cross-sectional view taken along a line A-A' of FIG. 3. FIG. 8 is a cross-sectional view taken along a line C-C' of FIG. 7. For convenience of explanation, the explanation will focus on points that are different from those explained using FIGS. 1 to 6.

Referring to FIGS. 7 and 8, in the semiconductor memory device according to some embodiments, a third point P3 of the first side wall S1 connected from the first portion SLC1 to the second portion SLC2, and a fourth point P4 of the second side wall S2 connected from the second portion SLC2 to the first portion SLC1 may be placed on the outer walls of the first and second channel structures CH1 and CH2. The third point P3 may be placed on the outer wall of the second channel structure CH2 inside which the second point P2 opposite (e.g., in the first direction D1) to the third point P3 is placed, and the fourth point P4 may be placed on the outer wall of the first channel structure CH1 inside which the first point P1 opposite (e.g., in the first direction D1) to the fourth point P4 is placed. The string cutting structure SLC between the first point P1 and the fourth point P4 opposite to each other (e.g., in the first direction D1) may be placed in the first channel structure CH1, and the string cutting structure SLC between the third point P3 and the second point P2 opposite each other (e.g., in the first direction D1) may be placed in the second channel structure CH2.

Figure 9:
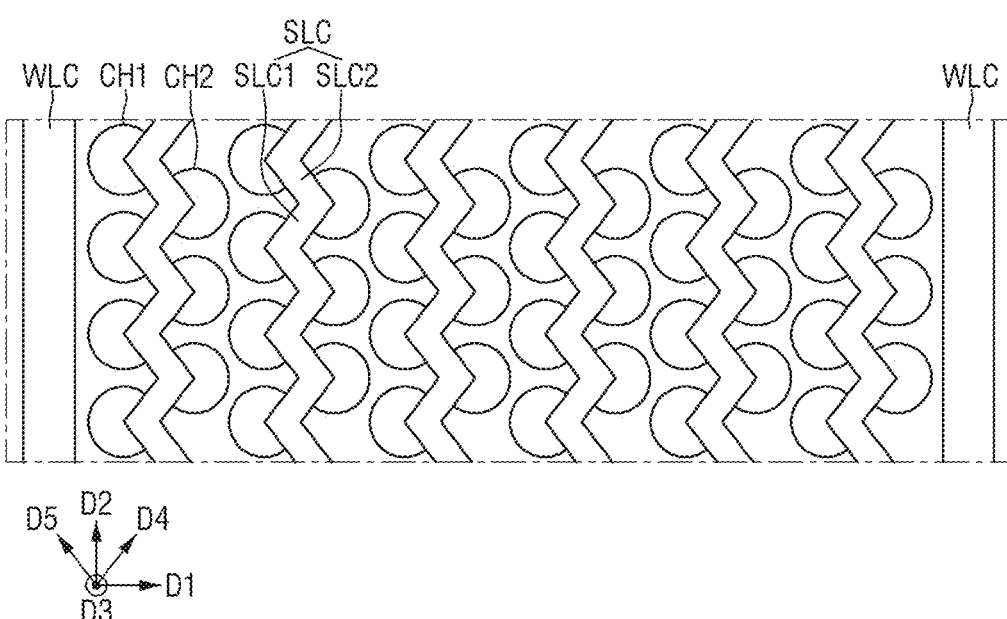
FIG. 9 is a layout diagram of the semiconductor memory device according to some embodiments.

FIG. 9 is a layout diagram of a semiconductor memory device according to some embodiments. For convenience of explanation, the explanation will focus on points that are different from those explained using FIGS. 1 to 8.

Referring to FIG. 9, in the semiconductor memory device according to some embodiments, the first channel structure CH1, the second channel structure CH2, and the string cutting structure SLC may be arranged along the first direction D1. The first channel structure CH1, the second channel structure CH2 and the string cutting structure SLC may be repeated along the first direction D1. The first channel structure CH1 and the second channel structure CH2 may be arranged in zigzags. The string cutting structure SLC may be placed inside all the channel structures CH1 and CH2 between the word line cutting structures WLC adjacent in the first direction D1. One string cutting structure SLC may be placed in one channel structure CH1, CH2. That is, unlike FIG. 3, the third channel structures CH3 may not be included.

Figure 10:
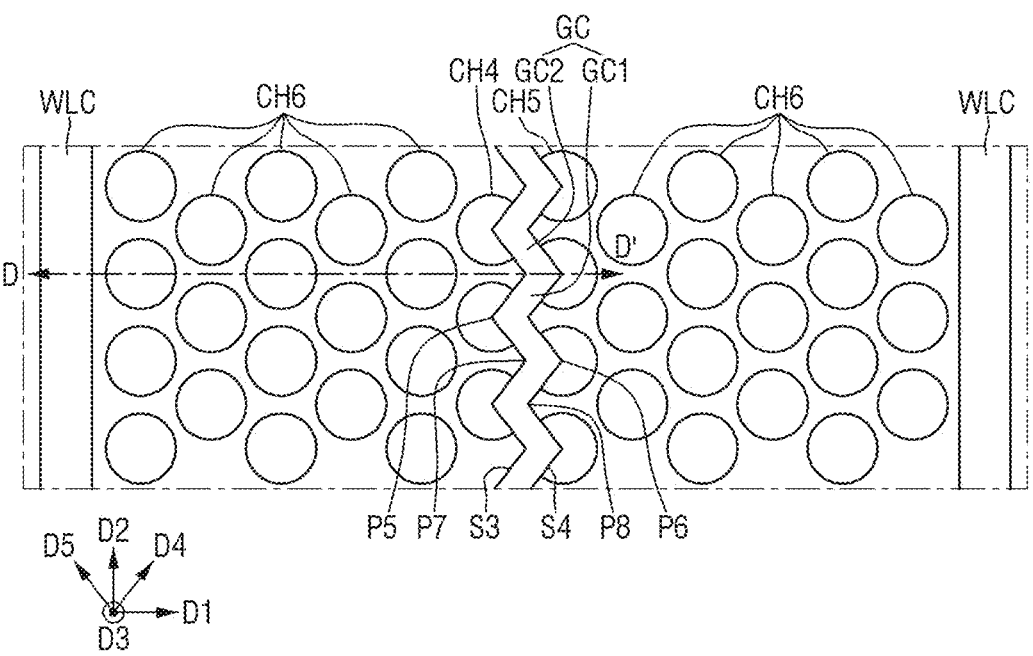
FIGS. 10 and 13 are layout diagrams of the semiconductor memory device according to some embodiments.
Figure 11:
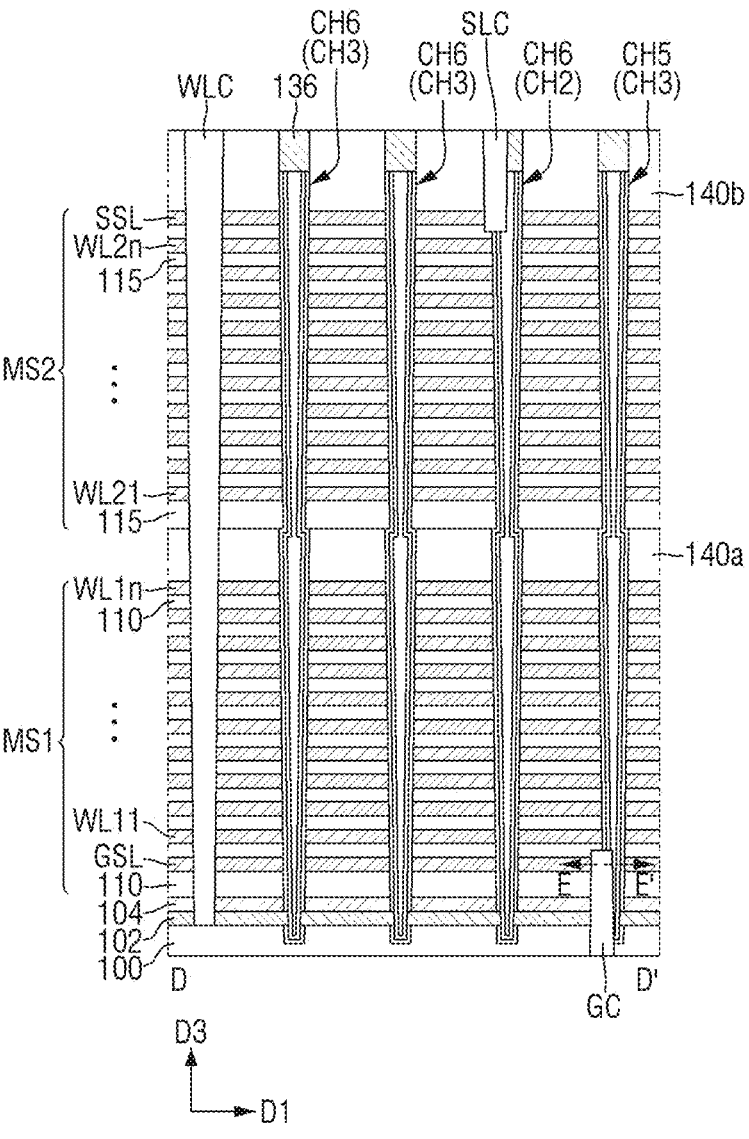
FIG. 11 is a cross-sectional view taken along a line D-D' of FIG. 10.
Figure 12:
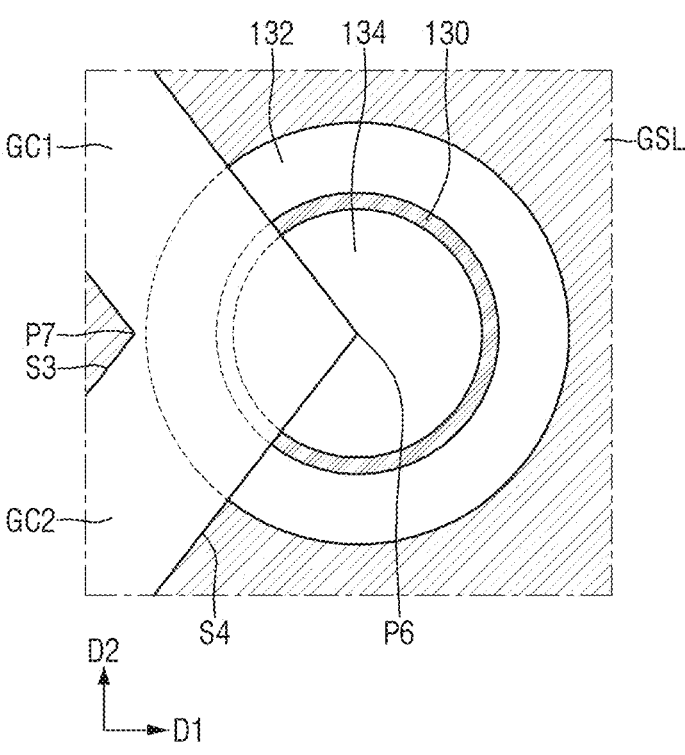
FIG. 12 is a cross-sectional view taken along a line E-E' of FIG. 11.
Figure 13:
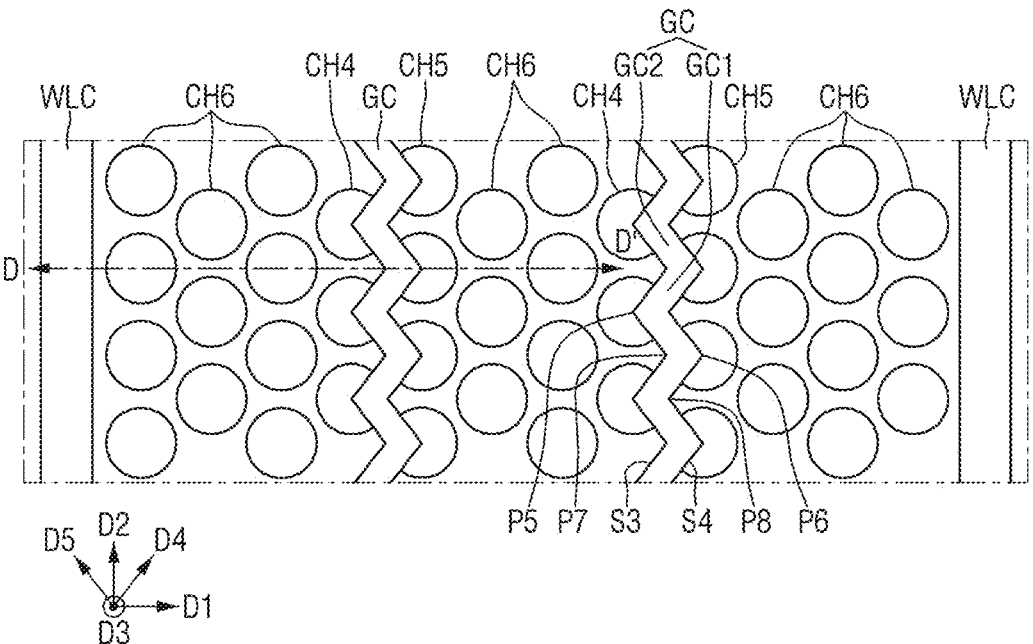
Figure 14:
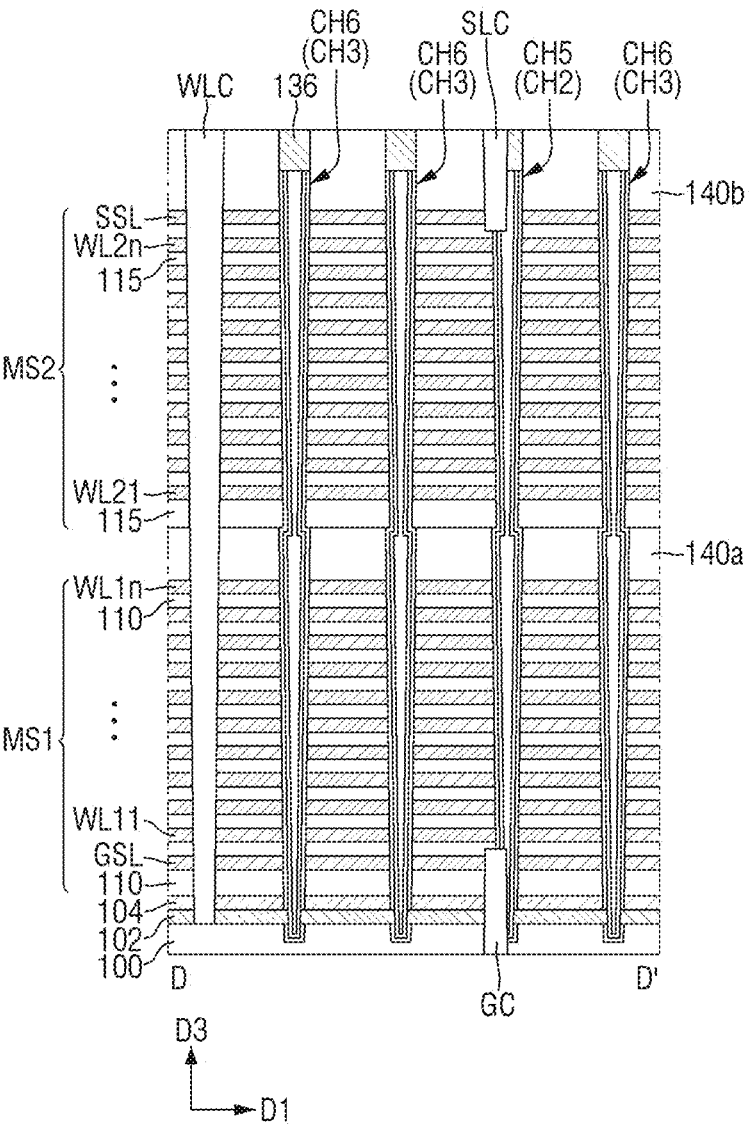
FIG. 14 is a cross-sectional view taken along a line D-D' of FIG. 13.

FIGS. 10 and 13 are layout diagrams of a semiconductor memory device according to some embodiments. FIG. 11 is a cross-sectional view taken along a line D-D' of FIG. 10. FIG. 12 is a cross-sectional view taken along a line E-E' of FIG. 11. FIG. 14 is a cross-sectional view taken along a line D-D' of FIG. 13. For convenience of explanation, the explanation will focus on points that are different from those explained using FIGS. 1 to 9. The string cutting structure SLC of FIG. 3 will be described as an example.

Referring to FIGS. 10 to 12, a semiconductor memory device according to some embodiments may further include a ground cutting structure GC. The ground cutting structure GC may be formed inside the first mold structure MS1. The ground cutting structure GC may penetrate the gate electrode placed at the lowermost part of the mold structures MS1 and MS2, that is, the ground selection line GSL. The ground cutting structure GC may extend in the third direction D3 and penetrate a part of the ground selection line GSL and the channel structures CH4 and CH5. The ground cutting structure GC may extend, for example, from the back side of the cell substrate 100 into the mold structures MS1 and MS2. The ground cutting structure GC may extend in the second direction D2 to cut the ground selection line GSL. The upper side of the ground cutting structure GC may be placed at a height between the ground selection line GL and the first gate electrode WL11 on the basis of the cell substrate 100. In some embodiments, the channel structures CH4, CH5, and CH6 may include fourth and fifth channel structures CH4 and CH5 having the ground cutting structure GC placed inside, and sixth channel structures CH6 having no ground cutting structure GC placed inside. The fourth channel structures CH4 and the fifth channel structures CH5 may each be arranged along the second direction D2. The fifth channel structures CH5 may be adjacent to the fourth channel structures CH4 in the first direction D1 and arranged in zigzags with the fourth channel structure CH4. The sixth channel structures CH6 may be adjacent to the fourth channel structure CH4 or the fifth channel structure CH5 in the first direction D1, arranged along the second direction D2, and arranged in zigzags with the fourth channel structures CH4 or the fifth channel structures CH5. The fourth to sixth channel structures CH4, CH5 and CH6 may be arranged in zigzags. The fourth to sixth channel structures CH4, CH5 and CH6 may have the same structures as those of the first to third channel structures CH1, CH2 and CH3. The fourth to sixth channel structures CH4, CH5 and CH6 may include a semiconductor pattern 130, an information storage film 132, a filling pattern 134, and a channel pad 136.

The ground cutting structure GC may have a first portion GC1 which extends from inside of each fourth channel structure CH4 to inside of each fifth channel structure CH5 adjacent to each fourth channel structure CH4 in the fourth direction D4, and a second portion GC2 which extends from inside of each fifth channel structure CH5 to each fourth portion channel structure CH4 adjacent to each second channel structure CH5 in the fifth direction D5. The first portion GC1 may extend in the fourth direction D4, and the second portion GC2 may extend in the fifth direction D5. The first portion GC1 and the second portion GC2 may be alternately arranged along the second direction D2 and connected to each other. The ground cutting structure GC may have a zigzag shape extending along the second direction D2. The first portion GC1 and the second portion GC2 that are sequentially placed and connected in the second direction D2 may have a ">" shape, and the second portion GC2 and the first portion GC1 that are sequentially placed and connected in the second direction D2 may have a "<"

shape. The portion connected from the first portion GC1 to the second portion GC2 of the ground cutting structure GC, and the portion connected from the second portion GC2 to the first portion GC1 may be rounded without being angulated.

The ground cutting structure GC may include a third side wall S3 and a fourth side walls S4 that are opposite to each other. The third side wall S3 and the fourth side wall S4 may be parallel to each other. The third side wall S3 and the fourth side wall S4 may extend in zigzags along the second direction D2. A fifth point P5 of the third side wall S3 connected from the second portion GC2 to the first portion GC1, and a sixth point P6 of the fourth side wall S4 connected from the first portion GC1 to the second portion GC2 may be placed in the fifth channel structures CH4 and CH5. The fifth point P5 may be placed inside the fourth channel structures CH4, and the sixth point P6 may be placed inside the fifth channel structures CH5.

The fifth point P5 and the sixth point P6 may be placed, for example, inside the semiconductor pattern 130. For example, from a planar viewpoint including the first and second directions D1 and D2, the fifth point P5 may be placed at the center of the fourth channel structure CH4, and the sixth point P6 may be placed at the center of the five-channel structure CH5.

In some embodiments, a seventh point P7 of the third side wall S3 connected from the first portion GC1 to the second portion GC2, and an eighth point P8 of the fourth side wall S4 connected from the second portion GC2 to the first portion GC1 may be spaced apart from the channel structures CH4, CH5 and CH6. The seventh point P7 and the eighth point P8 may be placed outside the channel structures CH4, CH5, and CH6. The seventh point P7 may be placed outside the fifth channel structure CH5 inside which the sixth point P6 opposite (e.g., in the first direction D1) to the seventh point P7 is placed, and the eighth point P8 may be placed outside the fourth channel structure CH4 inside which the fifth point P5 opposite (e.g., in the first direction D1) to the eighth point P8 is placed. The string cutting structure SLC between the first point P1 and the fourth point P4 that are opposite each other (e.g., in the first direction D1) may be placed in the fourth channel structure CH4 and the second mold structure MS2, and the ground cutting structure GC between the third point P3 and the second point P2 that are opposite to each other (e.g., in the first direction D1) may be placed in the fifth channel structure CH5 and the second mold structure MS2. The fourth and fifth channel structures CH4 and CH5 inside which at least part of the ground cutting structure GC is placed may have a sector shape from a planar viewpoint including the first and second directions D1 and D2. The fourth channel structures CH4 may be arranged on the third side wall S3 of the ground cutting structure GC along the second direction D2, and the fifth channel structures CH5 may be arranged on the fourth side wall S4 of the ground cutting structure GC along the second direction D2. The fourth channel structures CH4 may wrap a portion connected from the second portion GC2 to the first portion GC1, and the fifth channel structures CH5 may wrap the portion connected from the first portion GC1 to the second portion GC2.

Alternatively, in some embodiments, the seventh point P7 of the third side wall S3 connected from the first portion GC1 to the second portion GC2, and the eighth point P8 of the fourth side wall S4 connected from the second portion GC2 to the first portion GC1 may be placed on the outer walls of the fourth and fifth channel structures CH4 and CH5. The seventh point P7 may be placed on the outer wall of the second channel structure CH5 inside which the sixth point P6 opposite to the seventh point P7 (e.g., in the first direction D1) is placed, and the eighth point P8 may be placed on the outer wall of the fourth channel structure CH4 inside which the fifth point P5 opposite to the eighth point P8 (e.g., in the first direction D1) is placed. The string cutting structure SLC between the first point P1 and the fourth point P4 opposite to each other (e.g., in the first direction D1) may be placed in the fourth channel structure CH4, and the ground cutting structure GC between the third point P3 and the second point P2 opposite to each other (e.g., in the first direction D1) may be placed in the fifth channel structure CH5. Referring to FIG. 13, the ground cutting structure GC may be arranged along the first direction D1. For example, the ground cutting structures GC arranged in the second direction D2 may have the same shape. As yet another example, at least some of the ground cutting structures GC arranged in the second direction D2 may have different shapes from each other. For example, at least two ground cutting structures GC may have shapes symmetrical to each other on the basis of the first direction D1.

Referring to FIGS. 11 and 13, in some embodiments, sixth channel structures CH6 may be placed in at least one position between the word line cutting structure WLC and the ground cutting structure GC adjacent to each other in the first direction D1, and between the ground cutting structures GC adjacent to each other in the first direction D1. The sixth channel structures CH6 may, for example, be placed in multiple columns along the first direction D1.

In the semiconductor memory device according to some embodiments, the fourth channel structure CH4, the fifth channel structure CH5 and the ground cutting structure GC may be arranged along the first direction D1. The fourth channel structure CH4, the fifth channel structure CH5 and the ground cutting structure GC may be repeated along the first direction D1. The ground cutting structure GC may be placed inside all the channel structures CH4 and CH5 between the word line cutting structures WLC adjacent to each other in the first direction D1. One ground cutting structure GC may be placed in one channel structure CH1 and CH2. That is, unlike FIG. 10, the sixth channel structures CH6 may not be included.

The ground cutting structure GC may be placed in various ways independent of the placement of the string cutting structure SLC. The ground cutting structure GC may be placed in the same manner as the string cutting structure SLC, or may be placed differently from the string cutting structure SLC.

For example, a line D-D' of FIG. 10 may correspond to a line A-A' of FIG. 3. In FIGS. 3 and 10, the first to third channel structures CH1, CH2 and CH3 may be placed in first to twelfth columns between the word line cutting structures WLC along the first direction D1. In FIG. 3, the third channel structures CH3 may be placed in first to third columns, a sixth column, a seventh column, and tenth to twelfth columns, the first channel structures CH1 may be placed in the fourth and eighth columns, and the second channel structures CH2 may be placed in the fifth and ninth columns. In FIG. 10, the sixth channel structures CH6 may be placed in the first to third columns, the sixth column, the seventh column, and tenth to twelfth columns, the fourth channel structures CH4 may be placed in the fourth and eighth columns, and the fifth channel structure CH5 may be placed in the fifth and ninth columns. The channel structures CH1, CH2 and CH3 of FIG. 3 may correspond to channel structures CH4, CH5, and CH6 placed in the same column of FIG. 10. For example, the third channel structures CH3 of the seventh column of FIG. 3 may correspond to the fifth channel structures CH5 of the seventh column of FIG. 10. Referring to FIGS. 3, 10 and 11, the ground cutting structure GC may not overlap the string cutting structure SLC in the third direction D3. The ground cutting structure GC and the string cutting structure SLC may be placed in different channel structures CH1, CH2, CH4, and CH5 from each other.

For example, a line D-D' of FIG. 13 may correspond to a line A-A' of FIG. 3. The first to third channel structures CH1, CH2 and CH3 of FIG. 3 may correspond to the fourth to sixth channel structures CH4, CH5 and CH6 of FIG. 13, respectively. That is, the first and second channel structures CH1 and CH2 of FIG. 3 may be the fourth and fifth channel structures CH4 and CH5 of FIG. 10, respectively. Referring to FIGS. 3, 13 and 14, the ground cutting structure GC may overlap the string cutting structure SLC in the third direction D3. The ground cutting structure GC and the string cutting structure SLC may be spaced apart in the third direction D3 inside the same channel structure CH1, CH2, CH3, and CH4.

The ground cutting structure GC may include an insulating material, for example, but is not limited to, at least one of silicon oxide, silicon nitride and silicon oxynitride.

Figure 15:
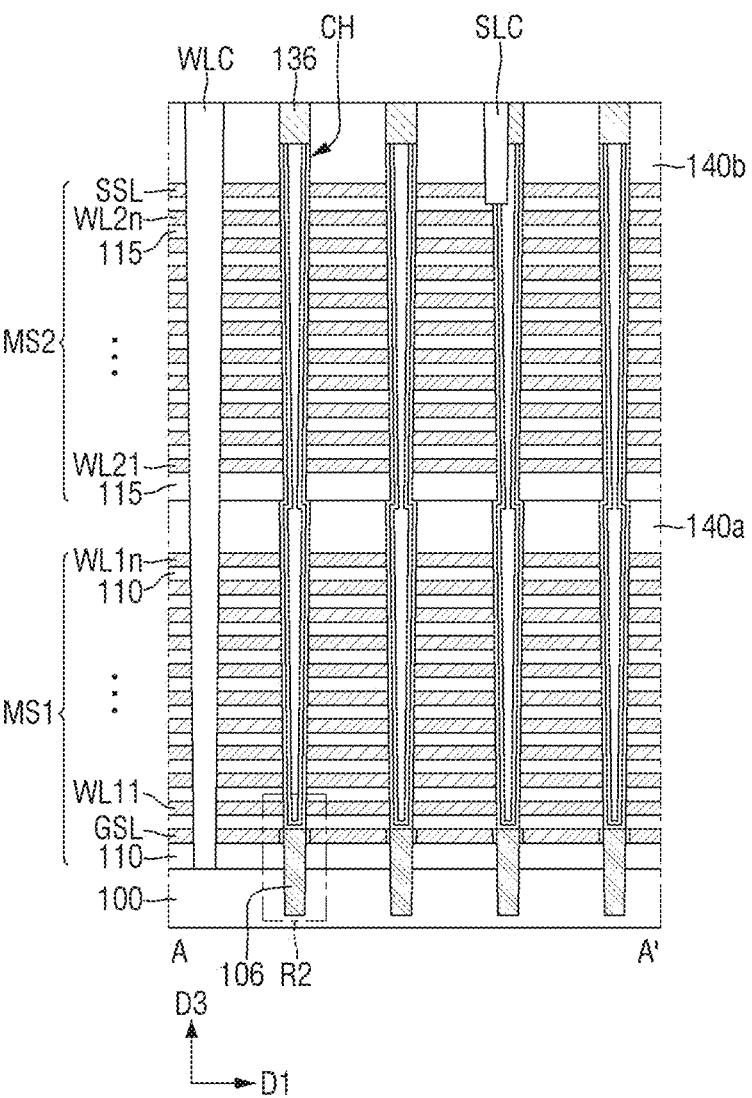
FIG. 15 is a cross-sectional view taken along a line A-A' of FIG. 3.
Figure 16:
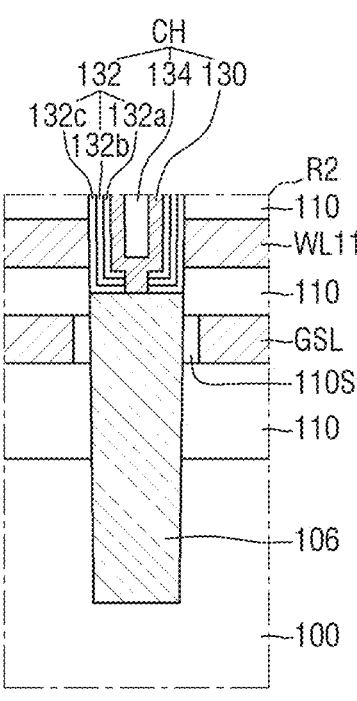
FIG. 16 is an enlarged view of a region R2 of FIG. 15.

FIG. 15 is a cross-sectional view taken along a line A-A' of FIG. 3. FIG. 16 is an enlarged view of a region R2 of FIG. 15. For convenience of explanation, the explanation will focus on points that are different from those explained using FIGS. 1 to 6.

Referring to FIGS. 15 and 16, the semiconductor memory device according to some embodiments includes a second source structure 106.

The second source structure 106 may be formed on the cell substrate 100. Although a lower part of the second source structure 106 is only shown as being placed inside the cell substrate 100, this is only an example. The second source structure 106 may be connected to the semiconductor pattern 130 of the channel structure CH. For example, the semiconductor pattern 130 may penetrate the information storage film 132 to come into contact with the upper side of the second source structure 106. The second source structure 106 may be formed from the cell substrate 100 by a selective epitaxial growth process, for example, but is not limited thereto.

In some embodiments, an upper side of the second source structure 106 may intersect some of the gate electrodes GSL, WL11 to WL1$n$, WL21 to WL2$n$, and SSL. As an example, the upper side of the second source structure 106 may be formed to be higher than the upper side of the ground selection line GSL. In this case, a gate insulating film 110S may be interposed between the gate electrode (e.g., the ground selection line GSL) intersecting the second source structure 106 and the second source structure 106.

Figure 17:
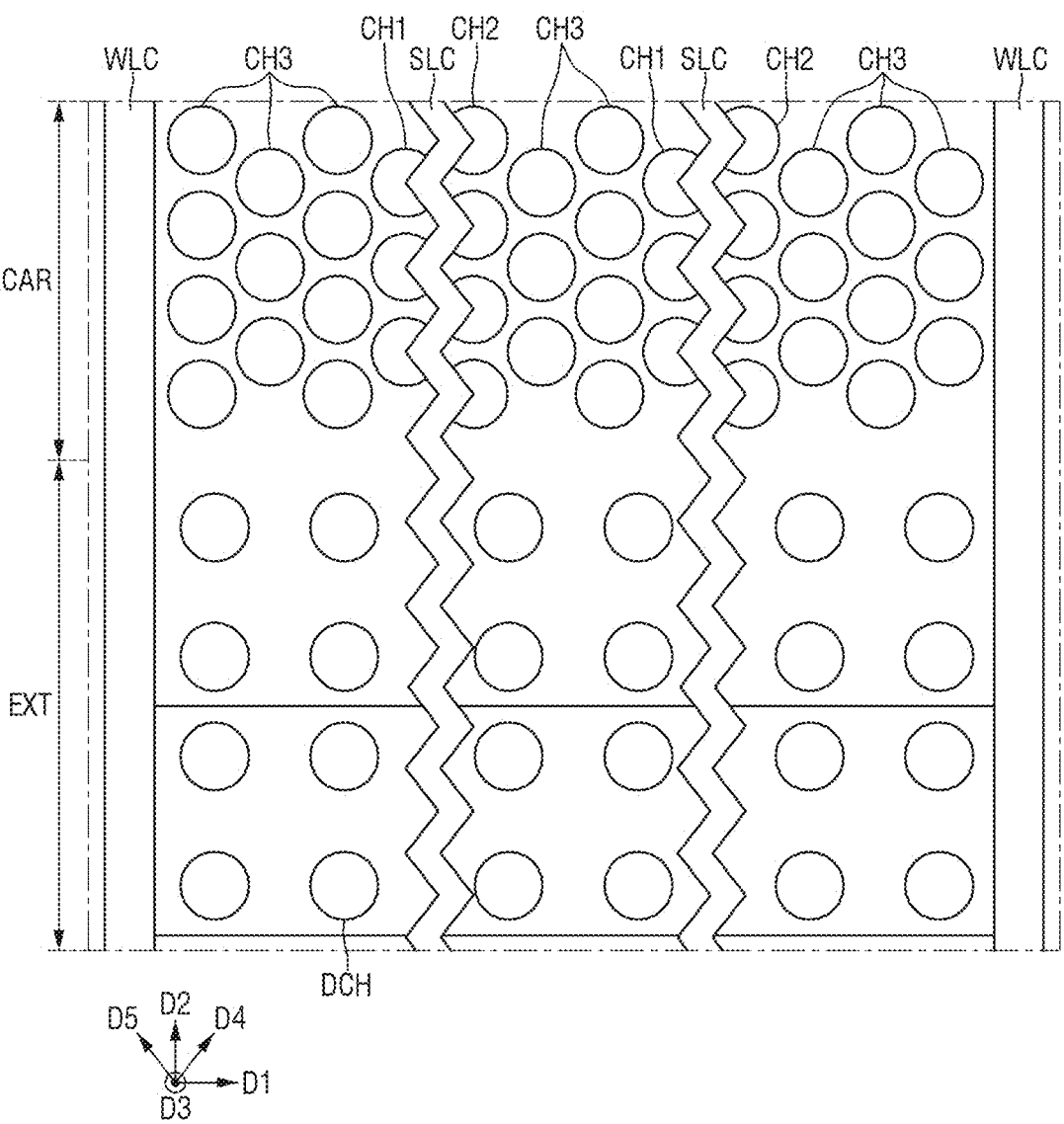
FIGS. 17 and 18 are layout diagrams of the semiconductor memory device according to some embodiments.
Figure 18:
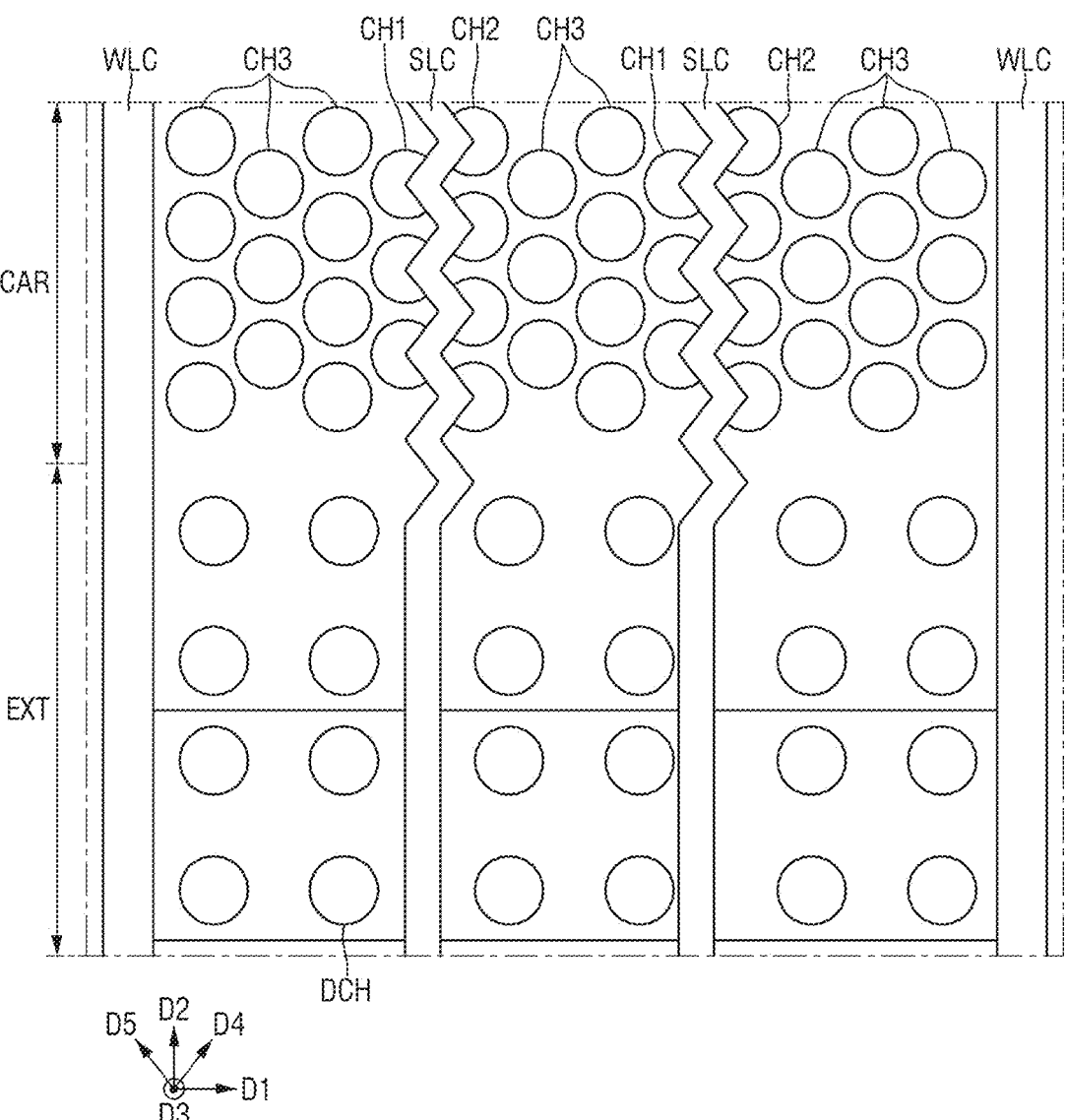

FIGS. 17 and 18 are layout diagrams of a semiconductor memory device according to some embodiments. For convenience of explanation, the explanation will focus on points different from those explained using FIGS. 1 to 16.

Referring to FIGS. 17 and 18, in the semiconductor memory device according to some embodiments, the cell substrate 100 may include a cell array region CAR and an extension region EXT. The memory cell array (e.g., 20 of FIG. 1) including a plurality of memory cells may be formed in the cell array region CAR. The extension region EXT may be placed around the cell array region CAR. The gate electrodes GSL, WL11 to WL1$n$, WL21 to WL2$n$, and SSL may be stacked stepwise in the extension region EXT. For example, the extension region EXT and the cell region CELL may be arranged along the second direction D2.

In some embodiments, a dummy channel structure DCH may be formed inside the mold structures MS1 and MS2 of the extension region EXT. The dummy channel structure DCH may be formed in a shape similar to that of the channel structure CH to reduce the stress applied to the mold structures MS1 and MS2 in the extension region EXT.

Referring to FIG. 17, the string cutting structure SLC may have a zigzag shape extending along the second direction D2 in the cell region CELL and the extension region EXT.

Referring to FIG. 18, the string cutting structure SLC may have a zigzag shape and a line shape extending along the second direction D2. In at least a part of the cell region CELL and the extension region EXT connected to the cell region CELL, the string cutting structure SLC may have a zigzag shape extending along the second direction D2. In the remaining extension region EXT, the string cutting structure SLC may have a line shape extending along the second direction D2. Alternatively, the string cutting structure SLC may have a zigzag shape in the cell region CELL and a line shape in the extension region EXT.

Figure 19:
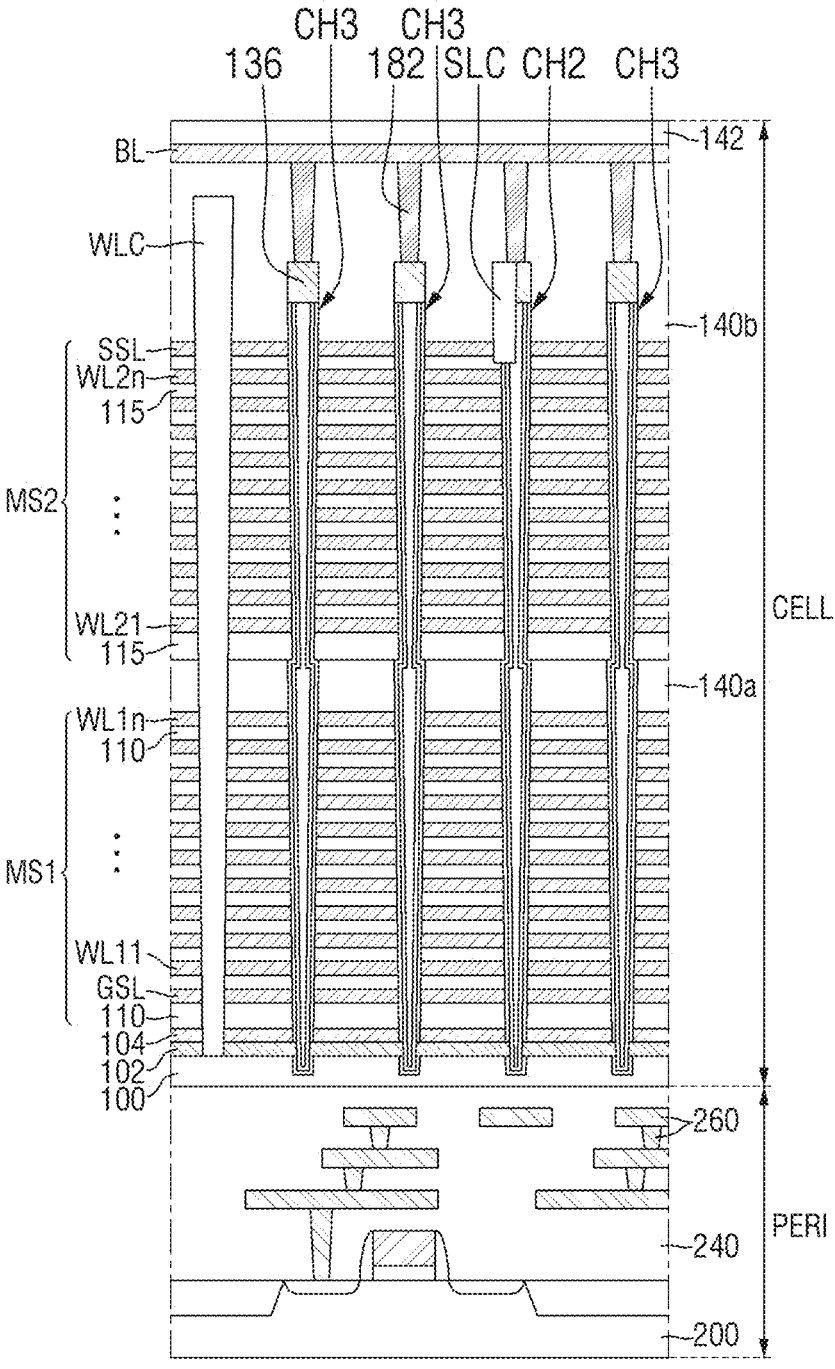
FIGS. 19 and 20 are cross-sectional views for explaining the semiconductor memory device according to some embodiments.
Figure 20:
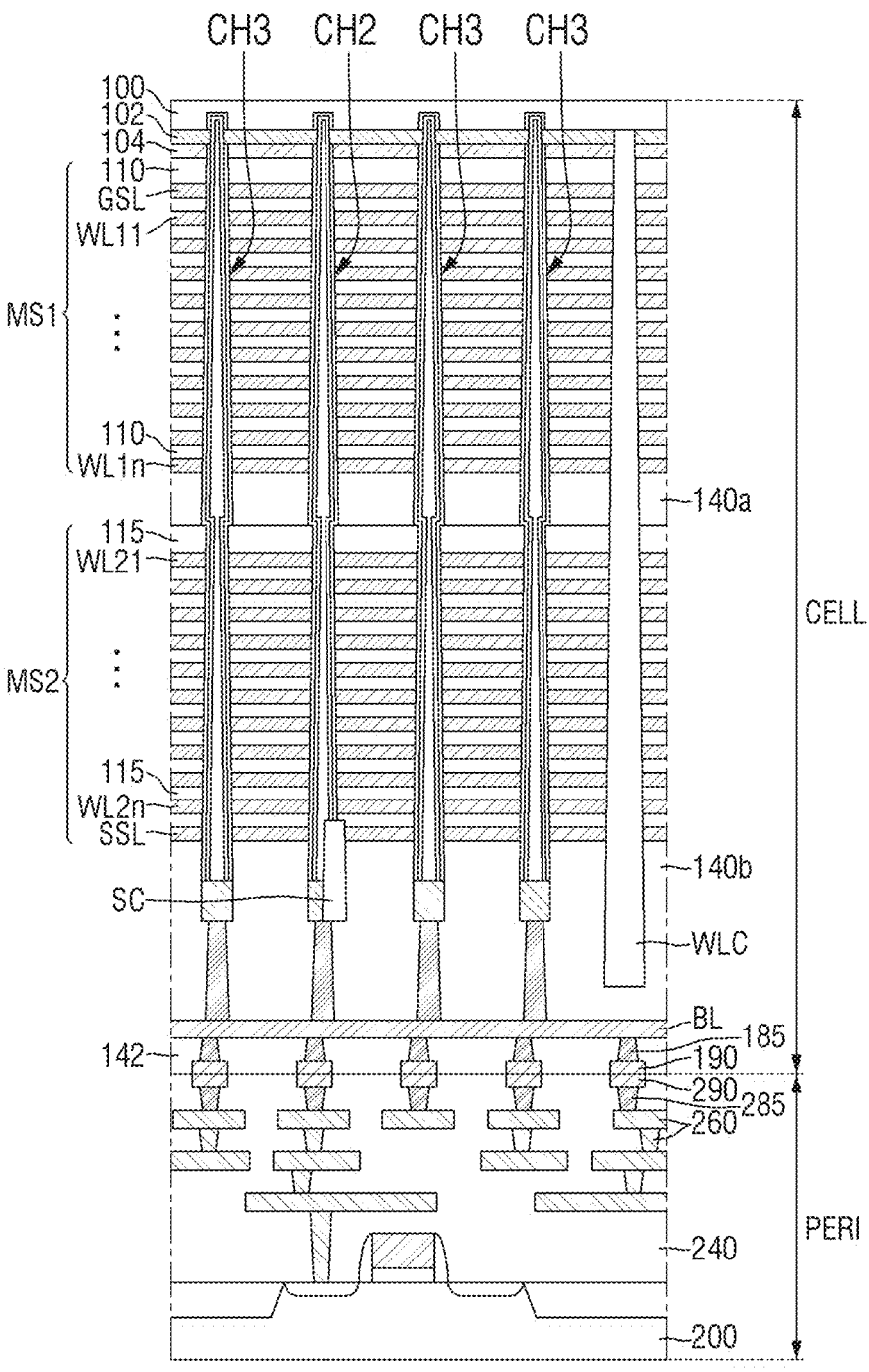

FIGS. 19 and 20 are cross-sectional views for explaining a semiconductor memory device according to some embodiments. For convenience of explanation, the explanation will focus on points that are different from those explained using FIGS. 1 to 6. In FIGS. 19 and 20, the cross-sectional view of FIG. 4 is shown as a cross-sectional view of the cell region CELL as an example.

Referring to FIGS. 19 and 20, a semiconductor memory device according to some embodiments may include a memory cell region CELL and a peripheral circuit region PERI.

The memory cell region CELL may include a cell substrate 100, mold structures MS1 and MS2, interlayer insulating films 140$a$ and 140$b$, channel structures CH1, CH2 and CH3, a word line cutting structure WLC, a string cutting structure SLC, a bit line BL and a first inter-wiring insulating film 142.

The bit line BL may be formed on the second mold structure MS2. For example, the first inter-wiring insulating film 142 may be formed on the second interlayer insulating film 140$b$, and the bit line BL may be formed in the first inter-wiring insulating film 142. The bit line BL may extend in the first direction D1 and may be connected to the channel structures CH1, CH2 and CH3 arranged along the first direction D1. For example, the bit line contact 182 connected to the upper parts of each of the channel structures CH1, CH2 and CH3 may be formed in the second interlayer insulating film 140$b$. The bit line BL may be electrically connected to the channel structures CH through the bit line contact 182.

The peripheral circuit region PERI may include a peripheral circuit substrate 200, a peripheral circuit element PT, and a wiring structure 260.

The peripheral circuit substrate 200 may include a semiconductor substrate such as, for example, a silicon substrate, a germanium substrate or a silicon-germanium substrate. Alternatively, the peripheral circuit substrate 200 may include a silicon-on-insulator (SOI) substrate, a germanium-on-insulator (GOI) substrate, or the like.

The peripheral circuit element PT may be formed on the upper side of the peripheral circuit substrate 200. The peripheral circuit element PT may constitute a peripheral circuit (e.g., 30 of FIG. 1) that controls the operation of the semiconductor memory device. For example, the peripheral circuit element PT may include a control logic (e.g., 37 of FIG. 1), a row decoder (e.g., 22 of FIG. 1), a page buffer (e.g., 35 of FIG. 1), and the like. In the following description, a surface of the peripheral circuit substrate 200 on which the peripheral circuit element PT is placed may be referred to as a front side of the peripheral circuit substrate 200. In contrast, a surface of the peripheral circuit substrate 200 opposite to the front side of the peripheral circuit substrate 200 may be referred to as a back side of the peripheral circuit substrate 200.

The peripheral circuit element PT may include, for example, but is not limited to, a transistor. For example, the peripheral circuit element PT may include not only various active elements such as a transistor, but also various passive elements such as a capacitor, a resistor and an inductor.

A wiring structure 260 connected to the peripheral circuit element PT may be formed in the second inter-wiring insulating film 240. The bit line BL, each of the gate electrodes GSL, WL11 to WL1n, WL21 to WL2n, and SSL and the first source structures 102 and 104 may be electrically connected to the peripheral circuit element PT.

Referring to FIG. 19, in the semiconductor memory device according to some embodiments, the back side of the cell substrate 100 may be opposite to the front side of the peripheral circuit substrate 200. For example, a second inter-wiring insulating film 240 that covers the peripheral circuit element PT may be formed on the upper side of the peripheral circuit substrate 200. The cell substrate 100 may be stacked on the upper side of the second inter-wiring insulating film 240.

Referring to FIG. 20, in the semiconductor memory device according to some embodiments, the upper side of the cell substrate 100 is opposite to the front side of the peripheral circuit substrate 200.

For example, the semiconductor memory device according to some embodiments may be a C2C (chip-to-chip) structure. The C2C structure means a structure in which an upper chip including a memory cell region CELL is manufactured on a first wafer (e.g., the cell substrate 100), and a lower chip including a peripheral circuit structure PERI is manufactured on a second wafer (e.g., the peripheral circuit substrate 200) different from the first wafer, and then, the upper chip and the lower chip are connected to each other by a bonding method.

As an example, the bonding method may mean a method of electrically connecting a first bonding pad 190 formed on the uppermost metal layer of the upper chip and a second bonding pad 290 formed on the uppermost metal layer of the lower chip to each other. For example, when the first bonding pad 190 and the second bonding pad 290 are formed of copper (Cu), the bonding method may be a Cu—Cu bonding method. However, this is only an example, and needless to say, the first bonding pad 190 and the second bonding pad 290 may be formed of various other metals such as aluminum (Al) or tungsten (W). The first bonding pad 190 and the bit line BL may be connected through the first via 185, and the second bonding pad 290 may be connected with the wiring structure 260 through the second via 285.

As the first bonding pad 190 and the second bonding pad 290 are bonded, the bit line BL, each of the gate electrodes GSL, WL11 to WL1n, WL21 to WL2n, and SSL and the first source structures 102 and 104 may be electrically connected to the peripheral circuit element PT.

Figure 21:
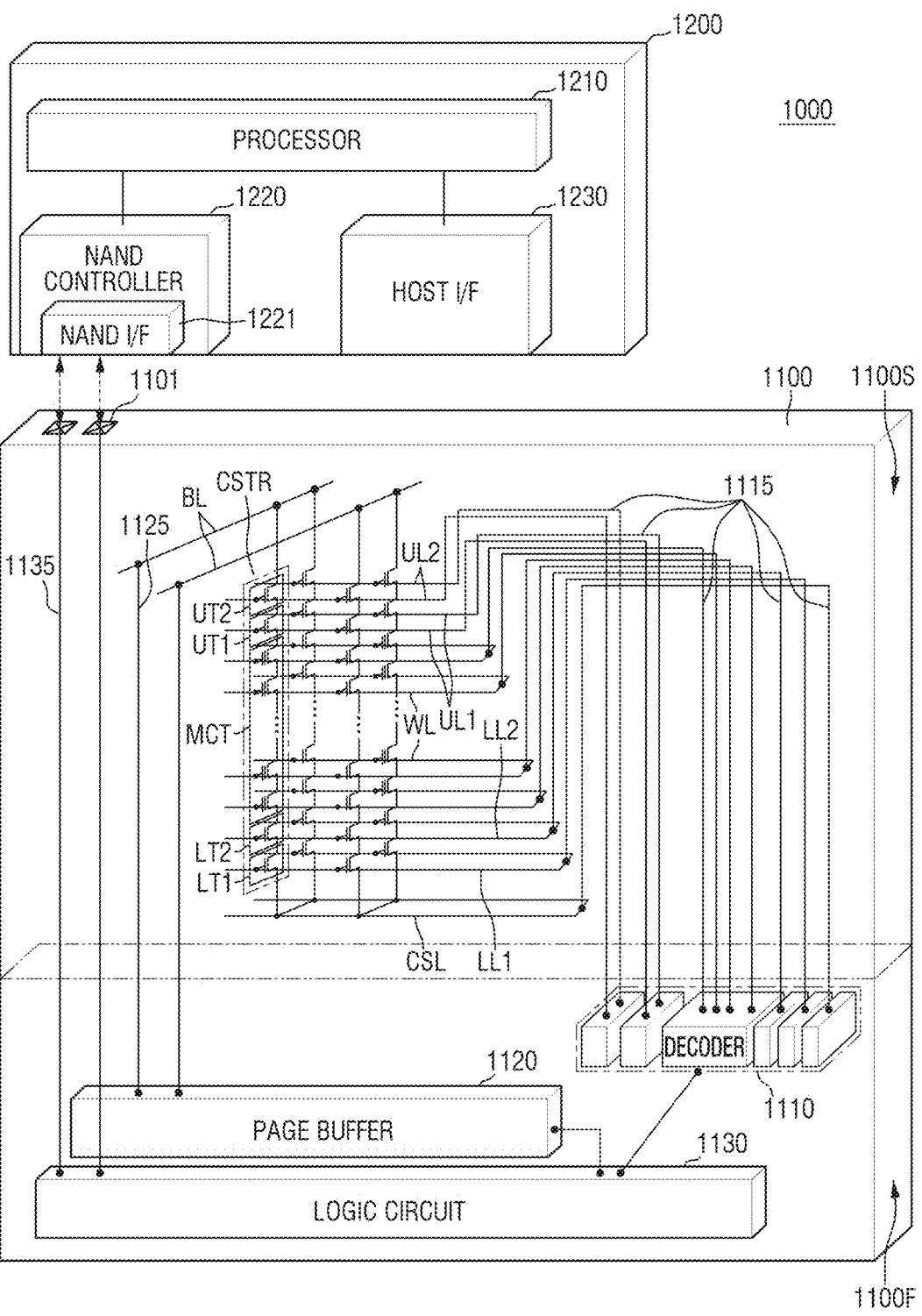
FIG. 21 is an example block diagram for explaining an electronic system according to some embodiments.

FIG. 21 is an example block diagram for explaining an electronic system according to some embodiments.

Referring to FIG. 21, an electronic system 1000 according to some embodiments may include a semiconductor memory device 1100, and a controller 1200 that is electrically connected to the semiconductor memory device 1100. The electronic system 1000 may be a storage device that includes one or multiple semiconductor memory devices 1100, or an electronic device that includes the storage device. For example, the electronic system 1000 may be an SSD device (solid state drive device), a USB (Universal Serial Bus), a computing system, a medical device or a communication device that includes one or multiple semiconductor memory devices 1100.

The semiconductor memory device 1100 may be a non-volatile memory device (e.g., a NAND flash memory device), and may be, for example, any one of the semiconductor memory devices explained above using FIGS. 1 to 20. The semiconductor memory device 1100 may include a first structure 1100F, and a second structure 1100S on the first structure 1100F. In example embodiments, the first structure 1100F may be placed next to the second structure 1100S. The first structure 1100F may be a peripheral circuit structure including a decoder circuit 1110, a page buffer 1120, and a logic circuit 1130. The second structure 1100S may be a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may be modified variously depending on embodiments.

In example embodiments, the upper transistors UT1 and UT2 may include a string selection transistor (SST of FIG. 2), and the lower transistors LT1 and LT2 may include a ground selection transistor (GST of FIG. 2). The gate lower lines LL1 and LL2 may be gate electrodes of the lower transistors LT1 and LT2, respectively. The word lines WL may be the gate electrode of the memory cell transistor MCT, and the gate upper lines UL1 and UL2 may be the gate electrodes of the upper transistors UT1 and UT2, respectively.

The common source line CSL, first and second gate lower lines LL1 and LL2, word lines WL, and first and second gate upper lines UL1 and UL2 may be electrically connected to the decoder circuit 1110 through first connection wirings 1115 extending from inside of the first structure 1100F to the second structure 1100S. The bit lines BL may be electrically connected to the page buffer 1120 through second connection wirings 1125 extending from inside of the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The electronic system 1000 may communicate with the controller 1200 through an I/O pad 1101 electrically connected to the logic circuit 1130. The I/O pad 1101 may be electrically connected to the logic circuit 1130 through the I/O connection wiring 1135 extending from inside of first structure 1100F to the second structure 1100S.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from the external host through the host interface 1230, the processor 1210 may control the semiconductor memory device 1100 in response to the control command.

Figure 22:
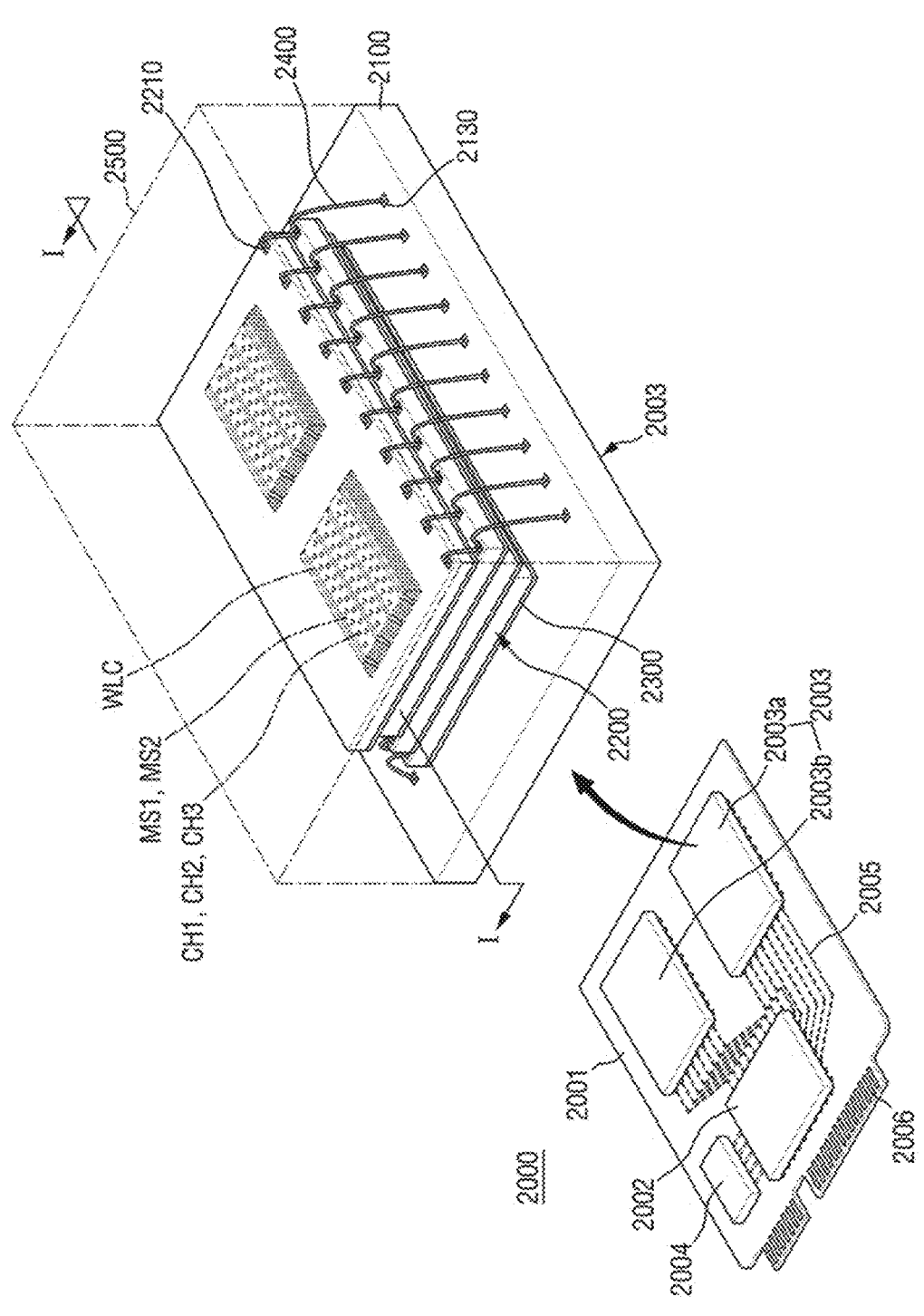
FIG. 22 is an example perspective view for explaining an electronic system according to some embodiments.

FIG. 22 is an example perspective view for explaining an electronic system according to some embodiments.

Referring to FIG. 22, the electronic system according to some embodiments may include a main board 2001, a main controller 2002 mounted on the main board 2001, one or more semiconductor packages 2003, and a DRAM 2004. The semiconductor package 2003 and the DRAM 2004 may be connected to the main controller 2002 by wiring patterns 2005 formed on the main board 2001.

The main board 2001 may include a connector 2006 including a plurality of pins coupled to an external host. In the connector 2006, the number and placement of the plurality of pins may vary depending on the communication interface between the electronic system 2000 and the external host. In some embodiments, the electronic system 2000 may communicate with the external host according to any one of interfaces such as M-Phy for USB (Universal Serial Bus), PCI-Express (Peripheral Component Interconnect Express), SATA (Serial Advanced Technology Attachment), and UFS (Universal Flash Storage). In some embodiments, the electronic system 2000 may operate by power supplied from the external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003*a* and a second semiconductor package 2003*b* that are spaced apart from each other. The first semiconductor package 2003*a* and the second semiconductor package 2003*b* may each be a semiconductor package that includes a plurality of semiconductor chips 2200. The first semiconductor package 2003*a* and the second semiconductor package 2003*b* may each include a package substrate 2100, semiconductor chips 2200 on the package substrate 2100, adhesive layers 2300 placed on the lower sides of each of the package chips 220, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 21. Each of the semiconductor chips 2200 may include a first mold structure MS1 and a channel structure CH. Each of the semiconductor chips 2200 may include any one of the semiconductor memory devices explained above with reference to FIGS. 1 to 20.

In some embodiments, the connecting structure 2400 may be a bonding wire that electrically connects the I/O pad 2101 and the package upper pads 2130. Therefore, in each of the first semiconductor package 2003*a* and the second semiconductor package 2003*b*, the semiconductor chips 2200 may be electrically connected to each other by a bonding wire method, and may be electrically connected to the package upper pads 2130 of the package substrate 2100. In some embodiments, in each of the first semiconductor package 2003*a* and the second semiconductor package 2003*b*, the semiconductor chips 2200 may be electrically connected to each other by a connecting structure including a through electrode (Through Silicon Via, TSV) instead of the connecting structure 2400 of the bonding wire method.

In some embodiments, the main controller 2002 and the semiconductor chips 2200 may also be included in a single package. In some embodiments, the main controller 2002 and the semiconductor chips 2200 are mounted on a separate interposer substrate different from the main board 2001, and the main controller 2002 and the semiconductor chips 2200 may also be connected to each other by the wiring formed on the interposer substrate.

Figure 23:
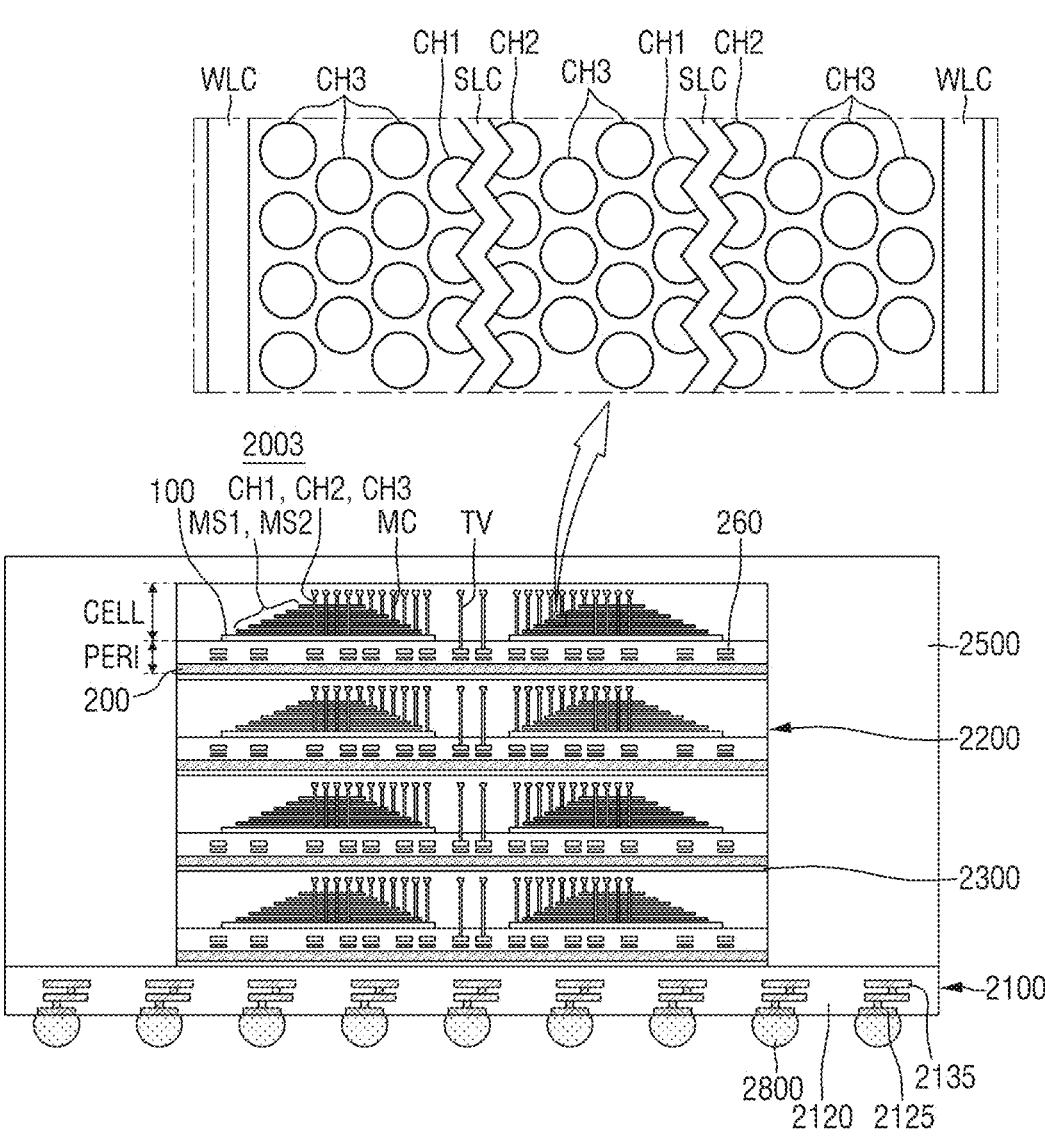
FIG. 23 is a cross-sectional view that schematically shows semiconductor packages according to some embodiments.

FIG. 23 is a cross-sectional view that schematically shows a semiconductor package according to some embodiments. FIG. 23 conceptually shows a region obtained by cutting the semiconductor package 2003 of FIG. 22 along a line I-I'.

Referring to FIG. 23, in some embodiments, the package substrate 2100 may be a printed circuit board. The package substrate 2100 may include a package substrate body portion 2120, package upper pads 2130 placed on an upper side of the package substrate body portion 2120, lower pads 2125 placed on a lower side of the package substrate body portion 2120 or exposed through the lower side, and inner wirings 2135 that electrically connect the package upper pads 2130 and the lower pads 2125 inside the package substrate body portion 2120. The package upper pads 2130 may be electrically connected to the connecting structure 2400. The lower pads 2125 may be connected to the wiring patterns 2005 of the main board 2001 of the electronic system 2000 through conductive connections 2800 as in FIG. 22.

Each of the semiconductor chips 2200 may include the semiconductor memory device described above using FIGS. 1 to 20. For example, each of the semiconductor chips 2200 may include a peripheral circuit structure PERI, and a memory cell region CELL stacked on the peripheral circuit structure PERI. As an example, the memory cell region CELL may include the cell substrate 100, the mold structures MS1 and MS2, the channel structure CH, the string cutting structure SLC, the ground cutting structure GC, the word line cutting structure SLC, and the bit line BL described above using FIGS. 1 to 17. Further, the memory cell region CELL may include gate connection wirings MC electrically connected to the gate electrodes 120 and 220 of the mold structures MS1 and MS2.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although example embodiments of the present disclosure have been described above with reference to the accompanying drawings, the present disclosure is not limited to the above embodiments, and may be fabricated in various forms. Those skilled in the art will appreciate that inventive concepts may be embodied in other specific forms without changing the technical spirit or essential features of the present disclosure. Accordingly, the above-described embodiments should be understood in all respects as illustrative and not restrictive.

What is claimed is:

1. A semiconductor memory device comprising:
   a cell substrate including a cell region and an extension region;
   a mold structure including a plurality of gate electrodes sequentially stacked on the cell substrate;
   a plurality of first channel structures penetrating the mold structure and arranged in a first direction on the cell region;
   a plurality of second channel structures penetrating the mold structure, the plurality of second channel structures being adjacent to the plurality of first channel structures in a second direction and arranged in the first direction on the cell region such that the plurality of first channel structures and the plurality of second channel structures are arranged in a zigzag pattern on the cell region; and
   a cutting structure including a first portion and a second portion that each have a line shape,
      the first portion extending in a third direction from inside of each of the plurality of first channel structures to inside of each of the plurality of second channel structures adjacent to each of the plurality of first channel structures, and
      the second portion extending in a fourth direction from inside of each of the plurality of second channel structures to inside of each of the plurality of first channel structures adjacent to each of the plurality of second channel structures,
      the fourth direction being different from the third direction,
   wherein the cutting structure cuts some of the plurality of gate electrodes.

2. The semiconductor memory device of claim 1, wherein the first portion and the second portion are connected to each other,
   the cutting structure extends in the first direction and has a zigzag shape.

3. The semiconductor memory device of claim 1, wherein the plurality of gate electrodes include a ground selection line, a plurality of word lines, and a string selection line, which are sequentially stacked on each other, and the cutting structure cuts the string selection line.

4. The semiconductor memory device of claim 3, wherein the extension region and the cell region are arranged by each other in the first direction,
   the cutting structure extends in the first direction, and
   the cutting structure has a zigzag shape in at least a part of the extension region.

5. The semiconductor memory device of claim 3, wherein the extension region and the cell region are arranged by each other the first direction, and
   the cutting structure extends in the first direction, and
   the cutting structure has a line shape in at least a part of the extension region.

6. The semiconductor memory device of claim 1, wherein the plurality of gate electrodes include a ground selection line, a plurality of word lines and a string selection line, which are sequentially stacked on each other, and the cutting structure cuts the ground selection line.

7. The semiconductor memory device of claim 1, wherein the plurality of first channel structures, the plurality of second channel structures, and the cutting structure are arranged by each other in the second direction.

8. The semiconductor memory device of claim 1, further comprising:
   a plurality of third channel structures penetrating the mold structure, wherein
   the plurality of third channel structures are spaced apart from the plurality of second channel structures in the second direction and arranged in the first direction in a zigzag arrangement.

9. The semiconductor memory device of claim 1, wherein the plurality of first channel structures and the plurality of second channel structures each include a filling pattern penetrating the mold structure, a semiconductor pattern between the filling pattern and the mold structure, and an information storage film between the semiconductor pattern and the mold structure,
   the first portion extends from the filling pattern of each of the plurality of first channel structures to the filling pattern of the plurality of second channel structures adjacent to each of the plurality of first channel structures in the third direction, and
   the second portion extends from the filling pattern of each of the plurality of second channel structures to the filling pattern of each of the plurality of first channel structures adjacent to each of the plurality of second channel structures in the fourth direction.

10. The semiconductor memory device of claim 1, wherein
   the cutting structure includes a first side wall and a second side wall opposing the first side wall,
   a first point of the first side wall connected from the first portion to the second portion is on a same plane as outer walls of the plurality of second channel structures or is spaced part from the plurality of second channel structures, and
   a second point of the second side wall connected from the second portion to the first portion is coplanar with outer walls of the plurality of first channel structures or is spaced apart from the plurality of first channel structures.

11. A semiconductor memory device comprising:

a cell substrate;

a mold structure including a plurality of gate electrodes sequentially stacked on the cell substrate;

a plurality of channel structures penetrating the mold structure; and a first cutting structure cutting some of the plurality of gate electrodes, the first cutting structure including a first portion having a line shape extending in a first direction and a second portion having a line shape extending in a second direction, the first portion and the second portion being alternately connected to form a zigzag shape, wherein the first cutting structure includes a first side wall and a second side wall opposing the first side wall, and a first point of the first side wall connected from the second portion to the first portion and a second point of the second side wall connected from the first portion to the second portion are in corresponding channel structures among the plurality of channel structures.

12. The semiconductor memory device of claim 11, wherein the plurality of gate electrodes include a ground selection line, a plurality of word lines, and a string selection line that are sequentially stacked along a third direction, and the first cutting structure cuts the string selection line.

13. The semiconductor memory device of claim 12, further comprising:

a second cutting structure cutting the ground selection line, wherein the second cutting structure includes a third portion having a line shape extending in the first direction and a fourth portion having a line shape extending in the second direction, the third portion and the fourth portion are alternately connected to form a zigzag structure, the second cutting structure includes a third side wall and a fourth side wall opposing the third side wall, and a third point of the third side wall connected from the fourth portion to the third portion, and a fourth point of the fourth side wall connected from the third portion to the fourth portion are placed inside the plurality of channel structures.

14. The semiconductor memory device of claim 13, wherein the second cutting structure does not overlap the first cutting structure in the third direction.

15. The semiconductor memory device of claim 13, wherein the second cutting structure overlaps at least a part of the first cutting structure in the third direction.

16. The semiconductor memory device of claim 11, wherein a third point of the first side wall connected from the first portion to the second portion and a fourth point of the second side wall connected from the second portion to the first portion are coplanar with outer walls of the plurality of channel structures or are spaced apart from the plurality of channel structures.

17. The semiconductor memory device of claim 11, wherein the first cutting structure is a plurality of first cutting structures extending in a third direction, the plurality of channel structures include a first channel structure and a second channel structure, at least a part of one of the plurality of first cutting structures is in the first channel structure and not in the second channel structure, and the second channel structure is between two of the plurality of first cutting structures adjacent to each other.

18. The semiconductor memory device of claim 11, further comprising:

a word line cutting structure adjacent to the first cutting structure, the first cutting structure extends in a third direction, the word line cutting structure cuts the plurality of gate electrodes, the plurality of channel structures includes a first channel structure and a second channel structure, at least a part of the first cutting structure is in the first channel structure and not in the second channel structure, and the second channel structure is between the first cutting structure and the word line cutting structure.

19. An electronic system comprising:

a main board;

a semiconductor memory device on the main board; and a controller on the main board, the controller being electrically connected to the semiconductor memory device, wherein the semiconductor memory device includes a cell substrate, a mold structure including a plurality of gate electrodes sequentially stacked on the cell substrate, a plurality of channel structures penetrating the mold structure, and a cutting structure cutting a part of the mold structure, each of the plurality of gate electrodes is connected to the controller, the cutting structure includes a first portion having a line shape extending in a first direction and a second portion having a line shape extending in a second direction, the first portion and the second portion are alternately connected to form a zigzag shape, the cutting structure includes a first side wall and a second side wall opposing the first side wall, and a first point of the first side wall connected from the second portion to the first portion and a second point of the second side wall connected from the first portion to the second portion are in corresponding channel structures among the plurality of channel structures.

20. The electronic system of claim 19, wherein the plurality of gate electrodes include a ground selection line, a plurality of word lines, and a string selection line, which are sequentially stacked, and the cutting structure cuts at least one of the string selection line and the ground selection line.

* * * * *